United States Patent
Nakamura et al.

(10) Patent No.: US 10,512,161 B2
(45) Date of Patent: Dec. 17, 2019

(54) RESIN SHEET

(71) Applicant: Ajinomoto Co., Inc., Tokyo (JP)

(72) Inventors: Shigeo Nakamura, Kawasaki (JP); Shiro Tatsumi, Kawasaki (JP); Ikumi Sawa, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

(21) Appl. No.: 16/286,237

(22) Filed: Feb. 26, 2019

(65) Prior Publication Data

US 2019/0200455 A1 Jun. 27, 2019

Related U.S. Application Data

(62) Division of application No. 15/472,684, filed on Mar. 29, 2017, now Pat. No. 10,257,928.

(30) Foreign Application Priority Data

Mar. 29, 2016 (JP) .................. 2016-066204

(51) Int. Cl.
*H05K 1/03* (2006.01)
*H01L 21/48* (2006.01)
(Continued)

(52) U.S. Cl.
CPC .......... *H05K 1/0373* (2013.01); *B32B 27/00* (2013.01); *C08G 59/621* (2013.01); *C08G 59/686* (2013.01); *C08L 63/00* (2013.01); *H01L 21/486* (2013.01); *H01L 21/4857* (2013.01); *H01L 21/6835* (2013.01); *H01L 23/145* (2013.01); *H01L 23/49894* (2013.01); *H05K 3/0011* (2013.01); *H05K 3/22* (2013.01); *H05K 3/4038* (2013.01); *H05K 3/4682* (2013.01); *H01L 2221/68345* (2013.01); *H05K 3/4673* (2013.01); (Continued)

(58) Field of Classification Search
None
See application file for complete search history.

(56) References Cited

U.S. PATENT DOCUMENTS 5,181,097 A 1/1993 Ogata
5,721,299 A 2/1998 Angelopoulos
(Continued)

FOREIGN PATENT DOCUMENTS

| JP | 10237323 A | 9/1998 |
|----|------------|--------|
| JP | 2006241411 A | 9/2006 |
| JP | 2014-152309 | 8/2014 |

OTHER PUBLICATIONS

Office Action dated Jul. 23, 2019 issued in corresponding Japanese patent application No. 2016-066204 (with partial English translation).

Primary Examiner — Hoa C Nguyen
(74) Attorney, Agent, or Firm — Oblon, McClelland, Maier & Neustadt, L.L.P.

(57) ABSTRACT

Resin sheets which includes a support and a resin composition layer in contact on the support, and which are characterized in that an extracted water conductivity A of a cured product of the resin composition layer when extracted at 120° C. for 20 hours is 50 µS/cm or less and an extracted water conductivity B of the cured product of the resin composition layer when extracted at 160° C. for 20 hours is 200 µS/cm or less, can provide a thin insulating layer having excellent insulating properties.

12 Claims, 1 Drawing Sheet

(51) Int. Cl.
    *H01L 21/683* (2006.01)
    *H01L 23/498* (2006.01)
    *H05K 3/00* (2006.01)
    *H05K 3/22* (2006.01)
    *H05K 3/40* (2006.01)
    *H05K 3/46* (2006.01)
    *B32B 27/00* (2006.01)
    *C08L 63/00* (2006.01)
    *H01L 23/14* (2006.01)
    *C08G 59/62* (2006.01)
    *C08G 59/68* (2006.01)

(52) U.S. Cl.
    CPC ............... *H05K 2201/0209* (2013.01); *H05K 2201/0212* (2013.01); *H05K 2203/06* (2013.01)

(56) References Cited

U.S. PATENT DOCUMENTS

| | | |
|---|---|---|
| 6,060,611 A | 5/2000 | Hara |
| 6,187,852 B1 | 2/2001 | Tungare |
| 6,555,187 B1 | 4/2003 | Kitamura |
| 6,746,770 B1 | 6/2004 | Afzali-Ardakani |
| 2002/0176046 A1 | 11/2002 | Kitamura |
| 2004/0161612 A1* | 8/2004 | Takanezawa ........ H05K 3/4676 428/414 |
| 2004/0258921 A1 | 12/2004 | Watanabe |
| 2005/0148694 A1 | 7/2005 | Inata |
| 2005/0281995 A1* | 12/2005 | Murai ................ B32B 7/12 428/209 |
| 2006/0216495 A1 | 9/2006 | Motobe |
| 2009/0008142 A1* | 1/2009 | Shimizu .................. B32B 5/18 174/261 |
| 2012/0168968 A1 | 7/2012 | Lee |
| 2013/0075142 A1 | 3/2013 | Izawa |
| 2014/0134475 A1* | 5/2014 | Kuramoto ................ B32B 7/12 429/176 |
| 2015/0014030 A1* | 1/2015 | Mitamura ............... B32B 15/08 174/257 |
| 2015/0050549 A1* | 2/2015 | Taniguchi ........... H01M 2/0267 429/176 |
| 2016/0046833 A1* | 2/2016 | Morishita ............ C09D 169/00 428/212 |
| 2017/0121569 A1* | 5/2017 | Taya ..................... B32B 7/12 |

* cited by examiner

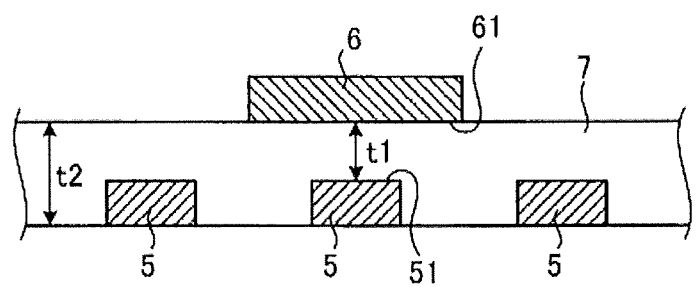

RESIN SHEET

CROSS REFERENCES TO RELATED APPLICATIONS

This application claims priority to Japanese Patent Application No. 2016-066204, filed on Mar. 29, 2016, which is incorporated herein by reference in its entirety.

BACKGROUND OF THE INVENTION

Field of the Invention

The present invention relates to resin sheets. The present invention also relates to printed wiring boards and semiconductor devices each including a cured product of resin composition layer of such a resin sheet.

Discussion of the Background

In recent years, in order to achieve downsizing of electronic devices, further thinning of printed wiring boards has been advanced and thus the thickness of internal layer substrates and insulating layers have tended to be thinner. As a technique of thinning of internal layer substrates and insulating layers, for example, a resin composition for forming a thin film described in JP-A-2014-152309, which is incorporated herein by reference in its entirety, has been known.

However, there remains a need for improved printed wiring boards.

SUMMARY OF THE INVENTION

In JP-A-2014-152309, the present inventors have found that when a thin film is used for an insulating layer, the roughness tends to increase and the peeling strength tends to decrease. In order to solve these problems, the present inventors have suggested adding a thermoplastic resin in a predetermined amount. In the literature, however, the insulating property when the insulating layer is made to be thin (hereinafter, may also be referred to as "thin film insulating property") has not been studied at all.

When the insulating layer is a thin film, retaining the insulating property becomes difficult compared with conventional ones, because contact of inorganic filler particles with each other causes electric current to easily flow through their interfaces, an increase in electrostatic capacity due to the thinner insulating layer easily causes short circuit, and the like.

Accordingly, it is one object of the present invention to provide novel resin sheets that can provide a thin insulating layer having an excellent insulating property.

It is another object of the present invention to provide novel printed wiring boards and semiconductor devices each including a cured product of resin composition layer of such a resin sheet.

These and other objects, which will become apparent during the following detailed description, have been achieved by the inventors' discovery that a resin sheet including a support and a resin composition layer being in contact on the support, in which the cured product of the resin composition layer satisfies at least one of the predetermined extracted water conductivity and the predetermined tensile breaking strength ratio, can provide an insulating layer having excellent insulating property (excellent thin film insulating property) even when the thickness of the insulating layer is thin. More specifically, the present inventors have found that the insulating layer having excellent thin film insulating property can be provided by lowering the extracted water conductivity of the cured product when extracted at high temperature or reducing the deterioration in the tensile breaking strength when the cured product is placed under a high-temperature and high-humidity environment.

Specifically, the present invention provides the following embodiments:

(1) A resin sheet comprising:

a support; and a resin composition layer being in contact on the support, wherein an extracted water conductivity A of a cured product of the resin composition layer when extracted at 120° C. for 20 hours is 50 μS/cm or less and an extracted water conductivity B of the cured product of the resin composition layer when extracted at 160° C. for 20 hours is 200 μS/cm or less.

(2) The resin sheet according to (1), wherein a glass transition temperature of the cured product of the resin composition layer is 160° C. or more.

(3) A resin sheet comprising:

a support; and a resin composition layer being in contact on the support, wherein a ratio (B/A) of a tensile breaking strength B of a 10 μm thickness cured product of the resin composition layer after a HAST test to a tensile breaking strength A of a 10 μm thickness cured product of the resin composition layer is 0.65 or more and 1 or less.

(4) The resin sheet according to (3), wherein the tensile breaking strength B is 50 MPa or more.

(5) The resin sheet according to any one of (1) to (4), wherein the resin composition layer has a thickness of 15 μm or less.

(6) The resin sheet according to any one of (1) to (5), wherein the resin composition layer has a lowest melt viscosity of 1000 poise or more.

(7) The resin sheet according to any one of (1) to (6), wherein the resin composition layer contains an epoxy resin and a curing agent.

(8) The resin sheet according to any one of (1) to (7), wherein the resin composition layer contains an inorganic filler, and the inorganic filler has a content of 50% by mass or more when a nonvolatile component in the resin composition layer is determined to be 100% by mass.

(9) The resin sheet according to (8), wherein the inorganic filler has an average particle diameter of 0.05 μm to 0.35 μm.

(10) The resin sheet according to (8) or (9), wherein a product of a specific surface area ($m^2/g$) and a true density ($g/cm^3$) of the inorganic filler is 0.1 to 77.

(11) The resin sheet according to any one of (1) to (10), wherein the resin sheet is used for forming an insulating layer of a printed wiring board.

(12) The resin sheet according to any one of (1) to (11), wherein the resin sheet is used for forming an insulating layer of a printed wiring board comprising a first conductive layer, a second conductive layer, and the insulating layer that insulates the first conductive layer from the second conductive layer and has a thickness of 6 μm or less between the first conductive layer and the second conductive layer.

(13) A printed wiring board comprising:
a first conductive layer,
a second conductive layer, and
an insulating layer that insulates the first conductive layer from the second conductive layer and has a thickness of 6 μm or less between the first conductive layer and the second conductive layer, wherein
the insulating layer is the cured product of the resin composition layer of the resin sheet according to any one of (1) to (12).

(14) A semiconductor device, comprising the printed wiring board according to (13).

Advantageous Effects of Invention

The present invention can provide a resin sheet that can provide a thin insulating layer having an excellent insulating property.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:
FIG. 1 is a partial cross-section view schematically illustrating an embodiment of a printed wiring board.

EXPLANATION OF REFERENCE NUMERALS 5 first conductive layer
51 main surface of first conductive layer
6 second conductive layer
61 main surface of second conductive layer
7 insulating layer

DETAILED DESCRIPTION OF THE PREFERRED EMBODIMENTS

Hereinafter, the resin sheet of the present invention, and the printed wiring board and the semiconductor device each including a cured product of resin composition layer of the resin sheet will be described in detail.

The resin sheet of the present invention includes a support and a resin composition layer being in contact on the support. The present invention is characterized in that a cured product of the resin composition layer satisfies at least one of the specific extracted water conductivity (Property 1) and the specific tensile breaking strength ratio (Property 2) noted below. In Property 2, "tensile breaking strength A of a 10 μm thickness cured product of the resin composition layer" means "tensile breaking strength A before a HAST test that a cured product of the resin composition layer exhibits when a thickness thereof is 10 μm." Also, "tensile breaking strength B of a 10 μm thickness cured product of the resin composition layer after HAST test" means "tensile breaking strength B after HAST test that a cured product of the resin composition layer exhibits when a thickness thereof is 10 μm." It is noted that Property 2 does not limit a thickness of resin composition layer in the resin sheet.
Property 1
An extracted water conductivity A of a cured product of the resin composition layer when extracted at 120° C. for 20 hours is 50 μS/cm or less and an extracted water conductivity B of a cured product of the resin composition layer when extracted at 160° C. for 20 hours is 200 μS/cm or less.

Property 2
A ratio (B/A) of a tensile breaking strength B of a 10 μm thickness cured product of the resin composition layer after HAST test to a tensile breaking strength A of a 10 μm thickness cured product of the resin composition layer is 0.65 or more and 1 or less.

The resin composition layer is formed from resin composition. There will be firstly described a resin composition for forming the resin composition layer.
Resin Composition
The resin composition is not particularly limited as long as a cured product of resin composition layer formed from the resin composition satisfies at least one of Property 1 and Property 2. Examples of the resin composition that provides the cured product satisfying at least one of Property 1 and Property 2 may include a composition containing a curable resin and a curing agent thereof. As the curable resin, known curable resins used for forming the insulating layer of a printed wiring board may be used. Among them, an epoxy resin is preferable. In one embodiment, therefore, the resin composition contains (A) an epoxy resin and (B) a curing agent. The resin composition preferably contains (C) an inorganic filler. The resin composition may contain additives such as a thermoplastic resin, a curing accelerator, a flame retardant, and an organic filler, if necessary.

Hereinafter, there will be described (A) the epoxy resin, (B) the curing agent, (C) the inorganic filler and the additives that may be used as a material for the resin composition.
(A) Epoxy Resin
Examples of (A) the epoxy resin may include a bisphenol A epoxy type resin, a bisphenol F type epoxy resin, a bisphenol S type epoxy resin, a bisphenol AF type epoxy resin, a dicyclopentadiene type epoxy resin, a trisphenol type epoxy resin, a naphthol novolac type epoxy resin, a phenol novolac type epoxy resin, a tert-butyl-catechol type epoxy resin, a naphthalene type epoxy resin, a naphthol type epoxy resin, an anthracene type epoxy resin, a glycidylamine type epoxy resin, a glycidyl ester type epoxy resin, a cresol novolac type epoxy resin, a biphenyl type epoxy resin, a linear aliphatic epoxy resin, an epoxy resin having a butadiene structure, an alicyclic epoxy resin, a heterocyclic epoxy resin, a Spiro ring containing epoxy resin, a cyclohexane dimethanol type epoxy resin, a naphthylene ether type epoxy resin, a trimethylol type epoxy resin, and a tetraphenylethane type epoxy resin. These epoxy resin may be used alone or in combination of two or more kinds thereof. The component (A) is preferably one or more selected from the bisphenol A type epoxy resin, the bisphenol F type epoxy resin, and the biphenyl type epoxy resin.

The epoxy resin preferably contains an epoxy resin having two or more epoxy groups per molecule. It is preferable that the epoxy resin contains an epoxy resin having two or more epoxy groups per molecule in an amount of at least 50% by mass or more when the nonvolatile component in the epoxy resin is determined to be 100% by mass. In particular, it is preferable that the epoxy resin contain an epoxy resin that has two or more epoxy groups per molecule and is liquid at 20° C. (hereinafter referred to as "liquid epoxy resin") and an epoxy resin that has three or more epoxy groups per molecule and is solid at 20° C. (hereinafter referred to as "solid epoxy resin"). When the liquid epoxy resin and the solid epoxy resin are used in combination as the epoxy resin, a resin composition having excellent flexibility can be obtained. Further, the rupture strength of cured product of the resin composition is enhanced. In particular, the solid epoxy resin has high heat resistance, allows an extracted water conductivity of a cured product when extracted at high temperature to be easily lowered, and tends to suppress deterioration in a tensile breaking strength when a cured product is placed under high-temperature and high-humidity.

The liquid epoxy resin is preferably a bisphenol A type epoxy resin, a bisphenol F type epoxy resin, a bisphenol AF type epoxy resin, a naphthalene type epoxy resin, a glycidyl ester type epoxy resin, a glycidylamine type epoxy resin, a phenol novolac type epoxy resin, an alicyclic epoxy resin having an ester skeleton, a cyclohexane dimethanol type epoxy resin, a glycidylamine type epoxy resin, or an epoxy resin having butadiene structure; and more preferably, a glycidylamine type epoxy resin, a bisphenol A type epoxy resin, a bisphenol F type epoxy resin, a bisphenol AF type epoxy resin, and a naphthalene type epoxy resin. Specific examples of the liquid epoxy resin may include "HP4032", "HP4032D", and "HP4032SS" (naphthalene type epoxy resins) available from DIC Corporation, "828US" and "jER828EL" (bisphenol A type epoxy resins), "jER807" (a bisphenol F type epoxy resin), "jER152" (a phenol novolac type epoxy resin), "YL7760" (a bisphenol AF type epoxy resin) "630" and "630LSD" (glycidylamine type epoxy resins) available from Mitsubishi Chemical Corporation, "ZX1059" (mixed product of a bisphenol A type epoxy resin and a bisphenol F type epoxy resin) available from NIPPON STEEL & SUMIKIN CHEMICAL CO., LTD., "YD-8125G" (a bisphenol A type epoxy resin) available from NIPPON STEEL & SUMIKIN CHEMICAL CO., LTD., "EX-721" (a glycidyl ester type epoxy resin) available from Nagase ChemteX Corporation, "CELLOXIDE 2021P" (an alicyclic epoxy resin having an ester skeleton), "PB-3600" (an epoxy resin having a butadiene structure) available from Daicel Corporation, "ZX1658" and "ZX1658GS" (liquid 1,4-glycidyl cyclohexane) available from Nippon Steel Chemical Co., Ltd., and "630LSD" (a glycidylamine type epoxy resin) available from Mitsubishi Chemical Corporation. These resins may be used alone or in combination of two or more kinds thereof.

The solid epoxy resin is preferably a tetrafunctional naphthalene type epoxy resin, a cresol novolac type epoxy resin, a dicyclopentadiene type epoxy resin, a trisphenol type epoxy resin, a naphthol type epoxy resin, a biphenyl type epoxy resin, a naphthylene ether type epoxy resin, an anthracene type epoxy resin, a bisphenol A type epoxy resin, or a tetraphenyl ethane type epoxy resin; and more preferably a tetrafunctional naphthalene type epoxy resin, a naphthol type epoxy resin, or a biphenyl type epoxy resin. Specific examples of the solid epoxy resin may include "HP4032H" (a naphthalene type epoxy resin), "HP-4700" and "HP-4710" (tetrafunctional naphthalene type epoxy resins), "N-690" (a cresol novolac type epoxy resin), "N-695" (a cresol novolac type epoxy resin), "HP-7200", "HP-7200HH", and "HP-7200H" (dicyclopentadiene type epoxy resins), "EXA-7311", "EXA-7311-G3", "EXA-7311-G4", "EXA-7311-G4S", and "HP6000" (naphthylene ether type epoxy resins) available from DIC Corporation, "EPPN-502H" (a trisphenol type epoxy resin), "NC7000L" (a naphthol novolac type epoxy resin), "NC3000H", "NC3000", "NC3000L", and "NC3100" (biphenyl type epoxy resins) available from Nippon Kayaku Co., Ltd., "ESN475V" (a naphthalene type epoxy resin) and "ESN485" (a naphthol novolac type epoxy resin) available from NIPPON STEEL & SUMIKIN CHEMICAL CO., LTD., "YX4000H" and "YL6121" (biphenyl type epoxy resins), "YX4000HK" (a bixylenol type epoxy resin), and "YX8800" (an anthracene type epoxy resin) available from Mitsubishi Chemical Corporation, "PG-100" and "CG-500" available from Osaka Gas Chemicals Co., Ltd., "YL7800" (a fluorene type epoxy resin) available from Mitsubishi Chemical Corporation, and "jER1010" (a solid bisphenol A type epoxy resin) and "jER1031S" (a tetraphenylethane type epoxy resin) available from Mitsubishi Chemical Corporation.

As the epoxy resin, high purity resins (for example, resins in which an amount of ionic impurities such as chlorine ions is low) are preferable from the viewpoint of allowing an extracted water conductivity of a cured product of the resin composition layer to be easily lowered and suppressing deterioration in a tensile breaking strength when a cured product of the resin composition layer is placed under a high-temperature and high-humidity environment. Examples of the high purity epoxy resins may include "828US", "YL980", "1750", and "YL983U" available from Mitsubishi Chemical Corporation, and "YD-8125G", "YD-825GS", "ZX-1658GS", and "YDF-8170G" available from NIPPON STEEL & SUMIKIN CHEMICAL CO., LTD.

As the liquid epoxy resin, an aromatic epoxy resin having two or more epoxy groups per molecule and being in a liquid state at a temperature of 20° C. is preferable. As the solid epoxy resin, an aromatic epoxy resin having three or more epoxy groups per molecule and being in a solid state at a temperature of 20° C. is preferable. The aromatic epoxy resin referred to in the present invention means an epoxy resin having an aromatic ring structure in the molecule thereof.

When the liquid epoxy resin and the solid epoxy resin are used in combination as the epoxy resin, a mass ratio thereof (liquid epoxy resin:solid epoxy resin) is preferably in a range of 1:0.1 to 1:15. When the mass ratio of the liquid epoxy resin to the solid epoxy resin falls within such a range, the following effects can be obtained: i) moderate tackiness can be obtained when the resin composition is used in a resin sheet form; ii) sufficient flexibility can be obtained when the resin composition is used in a resin sheet form, and as a result, handleability is improved; and iii) a cured product having sufficient rupture strength can be obtained from the resin composition layer. From the viewpoints of the effects i) to iii), the mass ratio of the liquid epoxy resin to the solid epoxy resin (liquid epoxy resin:solid epoxy resin) is more preferably in a range of 1:2.0 to 1:12, and further preferably in a range of 1:3.0 to 1:10.

The content of the epoxy resin in the resin composition is preferably 5% by mass or more, more preferably 9% by mass or more, and further preferably 13% by mass or more from the viewpoint of obtaining the insulating layer exhibiting excellent tensile breaking strength and insulation reliability. The upper limit of the content of the epoxy resin is not particularly limited as long as the effects of the present invention are exerted, and is preferably 50% by mass or less and more preferably 40% by mass or less.

In the present invention, the content of each component in the resin composition is a value when the nonvolatile components in the resin composition is determined to be 100% by mass, unless otherwise specified.

The epoxy equivalent weight of the epoxy resin is preferably 50 to 5,000, more preferably 50 to 3,000, further preferably 80 to 2,000, and further more preferably 110 to 1,000. When the epoxy equivalent weight falls within such a range, the crosslinking density of the cured product of the resin composition layer becomes sufficient and an insulating layer having small surface roughness can be obtained. The epoxy equivalent weight can be measured in accordance with JIS K 7236. The epoxy equivalent weight means the mass of a resin containing one equivalent of epoxy group.

The weight average molecular weight of the epoxy resin is preferably 100 to 5,000, more preferably 250 to 3,000, and further preferably 400 to 1,500. Here, the weight average molecular weight of the epoxy resin is a polystyrene-equivalent weight average molecular weight measured by a gel permeation chromatography (GPC) method.

(B) Curing Agent

The curing agent is not particularly limited as long as it has a function of curing the epoxy resin. Examples thereof may include a phenol-based curing agent, a naphthol-based curing agent, an active ester-based curing agent, a benzoxazine-based curing agent, a cyanate ester-based curing agent, and a carbodiimide-based curing agent. The curing agents may be used alone or in combination of two or more kinds thereof.

As the phenol-based curing agent and the naphthol-based curing agent, a phenol-based curing agent having a novolac structure or a naphthol-based curing agent having a novolac structure is preferable from the viewpoint of heat resistance and water resistance. A nitrogen-containing phenol-based curing agent is preferable and a triazine skeleton-containing phenol-based curing agent is more preferable from the viewpoint of adhesion to the conductive layer. Among them, a triazine skeleton-containing phenol novolac curing agent is preferable from the viewpoint of highly satisfying heat resistance, water resistance, and adhesion to a conductive layer.

Specific examples of the phenol-based curing agent and the naphthol-based curing agent may include "MEH-7700", "MEH-7810", and "MEH-7851" available from Meiwa Plastic Industries, Ltd., "NHN", "CBN", and "GPH" available from Nippon Kayaku Co., Ltd., "SN170", "SN180", "SN190", "SN475", "SN485", "SN495", "SN-495V", "SN375", and "SN395" available from NIPPON STEEL & SUMIKIN CHEMICAL CO., LTD., and "TD-2090", "LA-7052", "LA-7054", "LA-1356", "LA-3018-50P", and "EXB-9500" available from DIC Corporation.

The active ester-based curing agent is not particularly limited, and a compound having two or more highly reactive ester groups per molecule, such as phenol esters, thiophenol esters, N-hydroxyamine esters, and esters of heterocyclic hydroxy compounds, is generally preferably used. It is preferable that the active ester-based curing agent be an active ester-based curing agent obtained by a condensation reaction of a carboxylic acid compound and/or a thiocarboxylic acid compound with a hydroxy compound and/or a thiol compound. In order to especially enhance the heat resistance, an active ester-based curing agent obtained from a carboxylic acid compound and a hydroxy compound is preferable, and an active ester-based curing agent obtained from a carboxylic acid compound and a phenol compound and/or a naphthol compound is more preferable. Examples of the carboxylic acid compound may include benzoic acid, acetic acid, succinic acid, maleic acid, itaconic acid, phthalic acid, isophthalic acid, terephthalic acid, and pyromellitic acid. Examples of the phenol compound or naphthol compound may include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, a dicyclopentadiene type diphenol compound, and phenol novolac. The "dicyclopentadiene type diphenol compound" herein is a diphenol compound obtained by condensation of one dicyclopentadiene molecule with two phenol molecules.

Specifically, an active ester compound containing a dicyclopentadiene type diphenol structure, an active ester compound containing a naphthalene structure, an active ester compound containing an acetylated compound of phenol novolac, and an active ester compound containing a benzoylated compound of phenol novolac are preferable. Among them, an active ester compound containing a naphthalene structure and an active ester compound containing a dicyclopentadiene type diphenol structure are more preferable. The "dicyclopentadiene type diphenol structure" is a divalent structural unit of phenylene-dicyclopentylene-phenylene.

Examples of a commercially available product of the active ester-based curing agent may include "EXB9451," "EXB9460," "EXB9460S," "HPC-8000-65T," "HPC-8000H-65TM," and "EXB-8000L-65TM" as an active ester compound containing a dicyclopentadiene type diphenol structure (available from DIC Corporation), "EXB9416-70BK" as an active ester compound containing a naphthalene structure (available from DIC Corporation), "DC808" as an active ester compound containing an acetylated compound of phenol novolac (available from Mitsubishi Chemical Corporation), "YLH1026" as an active ester compound containing a benzoylated compound of phenol novolac (available from Mitsubishi Chemical Corporation), "DC808" as an active ester curing agent that is an acetylated compound of phenol novolac (available from Mitsubishi Chemical Corporation), and "YLH1026," "YLH1030," and "YLH1048" as an active ester curing agent that is a benzoylated compound of phenol novolac (available from Mitsubishi Chemical Corporation).

Specific examples of the benzoxazine-based curing agent may include "HFB2006M" available from Showa Highpolymer Co., Ltd., and "P-d" and "F-a" available from Shikoku Chemicals Corporation.

Examples of the cyanate ester-based curing agent may include a bifunctional cyanate resin such as bisphenol A dicyanate, polyphenol cyanate, oligo(3-methylene-1,5-phenylenecyanate), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl)thioether, and bis(4-cyanatephenyl)ether; a polyfunctional cyanate resin derived from phenol novolac and cresol novolac; and a prepolymer in which these cyanate resin are partly triazinized. Specific examples of the cyanate ester-based curing agent may include "PT30" and "PT60" (both phenol novolac type polyfunctional cyanate ester resins), "ULL-950" (a multifunctional cyanate ester resin), and "BA230" and "BA230S75" (prepolymer in which bisphenol A dicyanate is partly or entirely triazinized to form a trimer) available from Lonza Japan Ltd.

Specific examples of the carbodiimide-based curing agent may include "V-03" and "V-07" available from Nisshinbo Chemical Inc.

The component (B) is preferably one or more selected from a phenol-based curing agent, a naphthol-based curing agent, an active ester-based curing agent, and a cyanate ester-based curing agent. The curing agent is preferably a curing agent having high heat stability from the viewpoint of allowing an extracted water conductivity of a cured product of the resin composition layer to be lowered and suppressing deterioration in a tensile breaking strength when a cured product of the resin composition layer is placed under a high-temperature and high-humidity environment.

Examples of the curing agent having high heat stability may include an active ester-based curing agent, a cyanate ester-based curing agent, and a carbodiimide-based curing agent. The curing agent is preferably one or more selected from an active ester-based curing agent and a cyanate ester-based curing agent, and further preferably an active ester-based curing agent from the viewpoint of achieving a high hydrophobic property and allowing an extracted water conductivity of a cured product of the resin composition layer to be lowered and suppressing deterioration a the tensile breaking strength when a cured product of the resin composition layer is placed under a high-temperature and high-humidity environment.

The quantitative ratio of the epoxy resin to the curing agent, in terms of a ratio of [the total number of epoxy groups in the epoxy resin]:[the total number of reactive groups in the curing agent], is in a range of preferably 1:0.01 to 1:2, more preferably 1:0.015 to 1:1.5, and further preferably 1:0.02 to 1:1. Herein, the reactive group in the curing agent is an active hydroxyl group, an active ester group, or the like, and varies depending on the kind of the curing agent. The total number of epoxy groups in the epoxy resin is a value obtained by dividing the mass of solid content in each epoxy resin by respective epoxy equivalent weights and summing the calculated values for all the epoxy resins. The total number of reactive groups in the curing agent is a value obtained by dividing the mass of solid content in each curing agent by respective reactive group equivalent weights and summing the calculated values for all the curing agents. When the quantitative ratio of the epoxy resin to the curing agent falls within such a range, the heat resistance of the cured product of the resin composition layer is more improved.

In one embodiment, the resin composition contains the epoxy resin and the curing agent noted above. It is preferable that the resin composition contain a mixture of the liquid epoxy resin and the solid epoxy resin (the mass ratio of the liquid epoxy resin:the solid epoxy resin is preferably 1:0.1 to 1:15, more preferably 1:0.3 to 1:12, and further preferably 1:0.6 to 1:10) as (A) the epoxy resin, and one or more selected from the group consisting of the phenol-based curing agent, the naphthol-based curing agent, the active ester-based curing agent, and the cyanate ester-based curing agent (preferably one or more selected from the group consisting of the active ester-based curing agent and the cyanate ester-based curing agent) as (B) the curing agent.

The content of the curing agent in the resin composition is not particularly limited and is preferably 30% by mass or less, more preferably 25% by mass or less, and further preferably 20% by mass or less. The lower limit is not particularly limited and is preferably 2% by mass or more.

(C) Inorganic Filler

In one embodiment, the resin composition may contain an inorganic filler. A material for the inorganic filler is not particularly limited. Examples thereof may include silica, alumina, glass, cordierite, silicon oxide, barium sulfate, barium carbonate, talc, clay, a mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium zirconate titanate, barium zirconate, calcium zirconate, zirconium phosphate, and zirconium phosphate tungstate. Among them, silica is particularly suitable. Examples of silica may include amorphous silica, fused silica, crystalline silica, synthetic silica, and hollow silica. As the silica, spherical silica is preferable. The inorganic fillers may be used alone or in combination of two or more kinds thereof.

The average particle diameter of the inorganic filler is preferably 0.35 μm or less, more preferably 0.32 μm or less, further preferably 0.3 μm or less, and further more preferably 0.29 μm or less from the viewpoint of highly filling the inorganic filler and improving the thin film insulating property. The lower limit of the average particle diameter is preferably 0.05 μm or more, more preferably 0.06 μm or more, and further preferably 0.07 μm or more from the viewpoint of improving dispersibility in the resin composition layer. Examples of commercially available products of the inorganic filler having such an average particle diameter may include "UFP-30" available from Denka Company Limited and "SPH 516-05" available from NIPPON STEEL & SUMIKIN MATERIALS Co., Ltd.

The average particle diameter of the inorganic filler can be measured by a laser diffraction and scattering method on the basis of the Mie scattering theory. Specifically, the particle size distribution of the inorganic filler is prepared on the basis of volume, and a median diameter thereof can be measured as an average particle diameter using a laser diffraction and scattering particle size distribution measuring device. As a measurement sample, a dispersion in which the inorganic filler is dispersed in methyl ethyl ketone by ultrasonication can be preferably used. As the laser diffraction and scattering particle size distribution measuring device, "SALD-2200" manufactured by Shimadzu Corporation or the like can be used.

The specific surface area of the inorganic filler is preferably 40 $m^2/g$ or less, more preferably 37 $m^2/g$ or less, and further preferably 33 $m^2/g$ or less from the viewpoint of lowering the lowest melt viscosity of the resin composition layer described below. The lower limit of the specific surface area is preferably 1 $m^2/g$ or more, more preferably 5 $m^2/g$ or more, further preferably 10 $m^2/g$ or more, or 15 $m^2/g$ or more from the viewpoint of maintaining adequate viscoelasticity of the resin composition layer. The specific surface area can be measured with, for example, a BET full automatic specific surface area measuring apparatus (Macsorb HM-1210, manufactured by Mountech Co., Ltd.).

The true density of the inorganic filler is preferably 15 $g/cm^3$ or less, more preferably 10 $g/cm^3$ or less, and further preferably 5 $g/cm^3$ or less from the viewpoint of improving dispersibility in the resin composition layer. The lower limit of the true density is preferably 1 $g/cm^3$ or more, more preferably 1.5 $g/cm^3$ or more, and further preferably 2.0 $g/cm^3$ or more. The true density can be measured with, for example, Micro Ultra-Pycnometer (MUPY-21T, manufactured by Quantachrome Instruments Japan G. K.).

The product of the specific surface area ($m^2/g$) of the inorganic filler and the true density ($g/cm^3$) of the inorganic filler is preferably 0.1 to 77, more preferably 26 to 77, further preferably 30 to 70, and further more preferably 35 to 70. When the product falls within the above range, the thin film insulating property can be improved.

From the viewpoint of enhancing the humidity resistance and dispersibility, it is preferable that the inorganic filler is surface-treated with at least one surface treatment agent such as a silane coupling agent, an alkoxysilane compound, an organosilazane compound, and the like. These surface treatment agents may be oligomers. Examples of the surface treatment agent may include a silane-based coupling agent such as an aminosilane-based coupling agent, an epoxysilane-based coupling agent and a mercaptosilane-based coupling agent; an alkoxysilane compound; an organosilazane compound; and a titanate-based coupling agent. Examples of commercially available surface treatment agents may include "KBM403" (3-glycidoxypropyltrimethoxysilane), "KBM803" (3-mercaptopropyltrimethoxy), "KBE903" (3-aminopropyltriethoxysilane), "KBM573" (N-phenyl-3-aminopropyltrimethoxysilane), "SZ-31" (hexamethyldisilazane), "KBM103" (phenyltrimethoxysilane), and "KBM-480" (a long chain epoxy type silane coupling agent), all available from Shin-Etsu Chemical Co., Ltd. The surface treatment agents may be used alone or in combination of two or more kinds thereof.

The degree of surface treatment with the surface treatment agent can be evaluated by the amount of carbon per unit surface area of the inorganic filler. In order to enhance the dispersibility of the inorganic filler, the amount of carbon per unit surface area of the inorganic filler is preferably 0.02 mg/m$^2$ or more, more preferably 0.1 mg/m$^2$ or more, and further preferably 0.2 mg/m$^2$ or more. In order to suppress an increase in the melt viscosity of resin varnish and the melt viscosity in a sheet form, the amount of carbon per unit surface area of the inorganic filler is preferably 1 mg/m$^2$ or less, more preferably 0.8 mg/m$^2$ or less, and further preferably 0.5 mg/m$^2$ or less.

The amount of carbon per unit surface area of the inorganic filler can be measured after the surface-treated inorganic filler is washed with a solvent such as methyl ethyl ketone (MEK). Specifically, a sufficient amount of MEK is added as the solvent to the inorganic filler which is surface-treated with the surface treatment agent, and the resultant mixture is washed by ultrasonication at 25° C. for 5 minutes. A supernatant liquid is removed and a solid content is dried. The amount of carbon per unit surface area of the inorganic filler can be measured using a carbon analyzer. As the carbon analyzer, "EMIA-320V" manufactured by Horiba Ltd., or the like can be used.

The content (filling amount) of the inorganic filler in the resin composition is 50% by mass or more, preferably 55% by mass or more, and more preferably 60% by mass or more when the nonvolatile component in the resin composition layer is determined to be 100% by mass from the viewpoint of improving the thickness stability of the resin composition layer. The upper limit of the content of the inorganic filler in the resin composition is preferably 85% by mass or less and more preferably 80% by mass or less from the viewpoint of improving the thin film insulating property and the tensile breaking strength of the insulating layer (a cured product of the resin composition layer).

(D) Thermoplastic Resin

The resin composition of the present invention may further contain (D) a thermoplastic resin.

Examples of the thermoplastic resin may include a phenoxy resin, a polyvinyl acetal resin, a polyolefine resin, a polybutadiene resin, a polyimide resin, a polyamideimide resin, a polyetherimide resin, a polysulfone resin, a polyether sulfone resin, a polyphenylene ether resin, a polycarbonate resin, a polyetherether ketone resin, and a polyester resin. A phenoxy resin is preferable. The thermoplastic resin may be used alone or in combination of two or more kinds thereof.

The polystyrene-equivalent weight average molecular weight of the thermoplastic resin is preferably in a range of 8,000 to 70,000, more preferably in a range of 10,000 to 60,000, and further preferably in a range of 20,000 to 60,000. The polystyrene-equivalent weight average molecular weight of the thermoplastic resin is measured by the gel permeation chromatography (GPC) method. Specifically, the polystyrene-equivalent weight average molecular weight of the thermoplastic resin can be determined by measurement using LC-9A/RID-6A manufactured by Shimadzu Corporation as a measurement apparatus, Shodex K-800P/K-804L/K-804L manufactured by Showa Denko K.K., as columns, and chloroform or the like as a mobile phase. The measurement is performed at a column temperature of 40° C., and the polystyrene-equivalent weight average molecular weight can be computed using a standard polystyrene calibration curve.

Examples of the phenoxy resin may include phenoxy resins having one or more skeletons selected from the group consisting of a bisphenol A skeleton, a bisphenol F skeleton, a bisphenol S skeleton, a bisphenol acetophenone skeleton, a novolac skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethyl cyclohexane skeleton. A terminal ends of the phenoxy resin may be any functional group such as a phenolic hydroxyl group and an epoxy group. The phenoxy resin may be used alone or in combination of two or more kinds thereof. Specific examples of the phenoxy resin may include "1256" and "4250" (both bisphenol A skeleton-containing phenoxy resins), "YX8100" (bisphenol S skeleton-containing phenoxy resin), and "YX6954" (bisphenol acetophenone skeleton-containing phenoxy resin) available from Mitsubishi Chemical Corporation. Additional examples thereof may include "FX280" and "FX293" available from Nippon Steel & Sumikin Chemical Co., Ltd., and "YX6954BH30," "YX7553," "YX7553BH30," "YL7769BH30," "YL6794," "YL7213," "YL7290," and "YL7482" available from Mitsubishi Chemical Corporation.

Examples of the polyvinyl acetal resin may include a polyvinyl formal resin and a polyvinyl butyral resin, and a polyvinyl butyral resin is preferable. Specific examples of the polyvinyl acetal resin include "Denka Butyral 4000-2", "Denka Butyral 5000-A", "Denka Butyral 6000-C", and "Denka Butyral 6000-EP" available from Denka Company Limited, and S-LEC BH series, BX series (for example, BX-5Z), KS series (for example, KS-1), BL series, and BM series available from Sekisui Chemical Co., Ltd.

Specific examples of the polyimide resin may include "RIKACOAT SN20" and "RIKACOAT PN20" available from New Japan Chemical Co., Ltd. Specific examples of the polyimide resin may include modified polyimides such as a linear polyimide obtained by reaction of a difunctional hydroxyl-terminated polybutadiene, a diisocyanate compound, and a tetrabasic acid anhydride (polyimide described in Japanese Patent Application Laid-Open No. 2006-37083, which is incorporated herein by reference in its entirety), and a polysiloxane skeleton-containing polyimide (polyimide described in Japanese Patent Application Laid-Open Nos. 2002-12667 and 2000-319386, which are incorporated herein by reference in their entireties).

Specific examples of the polyamideimide resin may include "VYLOMAX HR11NN" and "VYLOMAX HR16NN" available from Toyobo Co., Ltd. Additional examples of the polyamideimide resin may include modified polyamideimides such as "KS9100" and "KS9300" (polysiloxane skeleton-containing polyamideimide) available from Hitachi Chemical Company, Ltd.

Specific examples of the polyethersulfone resin may include "PES5003P" available from Sumitomo Chemical Co., Ltd.

Specific examples of the polysulfone resin may include polysulfones "P1700" and "P3500" available from Solvay Advanced Polymers K.K.

Among them, the phenoxy resin and the polyvinyl acetal resin are preferable as the thermoplastic resin. Consequently, in a preferred embodiment, the thermoplastic resin contains one or more selected from the group consisting of the phenoxy resin and the polyvinyl acetal resin.

When the resin composition contains the thermoplastic resin, the content of the thermoplastic resin is preferably 0.5% by mass to 10% by mass, more preferably 0.6% by mass to 5% by mass, and further preferably 0.7% by mass to 3% by mass.

(E) Curing Accelerator

The resin composition of the present invention may further contains (E) a curing accelerator.

Examples of the curing accelerator may include a phosphorus-based curing accelerator, an amine-based curing accelerator, an imidazole-based curing accelerator, a guanidine-based curing accelerator, a metallic curing accelerator, and an organic peroxide-based curing accelerator. A phosphorus-based curing accelerator, an amine-based curing accelerator, an imidazole-based curing accelerator, and a metallic curing accelerator are preferable, and an amine-based curing accelerator, an imidazole-based curing accelerator, and a metallic curing accelerator are more preferable. The curing accelerator may be used alone or in combination of two or more kinds thereof.

Examples of the phosphorus-based curing accelerator may include triphenyiphosphine, a phosphoniumborate compound, tetraphenylphosphonium tetraphenylborate, n-butylphosphonium tetraphenylborate, tetrabutylphosphonium decanoate, (4-methylphenyl)triphenylphosphonium thiocyanate, tetraphenylphosphonium thiocyanate, and butyltriphenylphosphonium thiocyanate. Triphenylphosphine and tetrabutylphosphonium decanoate are preferable.

Examples of the amine-based curing accelerator may include trialkylamine such as triethylamine and tributylamine, 4-dimethylaminopyridine, benzyldimethylamine, 2,4,6-tris(dimethylaminomethyl)phenol, and 1,8-diazabicyclo[5,4.0]undecene. 4-Dimethylaminopyridine and 1,8-diazabicyclo[5,4,0]-undecene are preferable.

Examples of the imidazole-based curing accelerator may include an imidazole compound such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, and 2-phenylimidazoline; and an adduct of such imidazole compound and an epoxy resin. 2-Ethyl-4-methylimidazole and 1-benzyl-2-phenylimidazole are preferable.

As the imidazole-based curing accelerator, a commercially available product may be used. Examples thereof may include "P200-H50" available from Mitsubishi Chemical Corporation.

Examples of the guanidine-based curing accelerator may include dicyandiamide, 1-methylguanidine, 1-ethylguanidine, 1-cyclohexylguanidine, 1-phenylguanidine, 1-(o-tolyl)guanidine, dimethylguanidine, diphenylguanidine, trimethylguanidine, tetramethylguanidine, pentamethylguanidine, 1,5,7-triazabicyclo[4.4.0]dec-5-ene, 7-methyl-1,5,7-triazabicyclo[4.4.0]dec-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide. Dicyandiamide and 1,5,7-triazabicyclo[4.4.0]dec-5-ene are preferable.

Examples of the metallic curing accelerator may include an organic complex and an organic salt of a metal such as cobalt, copper, zinc, iron, nickel, manganese, and tin. Specific examples of the organic metal complex may include an organic cobalt complex such as cobalt(II) acetylacetonate and cobalt(III) acetylacetonate, an organic copper complex such as copper(II) acetylacetonate, an organic zinc complex such as zinc(II) acetylacetonate, an organic iron complex such as iron(III) acetylacetonate, an organic nickel complex such as nickel(II) acetylacetonate, and an organic manganese complex such as manganese(II) acetylacetonate. Examples of the organic metal salt may include zinc octylate, tin octylate, zinc naphthenate, cobalt naphthenate, tin stearate, and zinc stearate.

Examples of the organic peroxide-based curing accelerator may include dicumyl peroxide, cyclohexanone peroxide, tert-butyl peroxybenzoate, methyl ethyl ketone peroxide, dicumyl peroxide, tert-bythyl cumyl peroxide, di-tert-butyl peroxide, diisopropylbenzene hydroperoxide, cumene hydroperoxide, and tert-butyl hydroperoxide. As the organic peroxide-based curing accelerator, a commercially available product may be used. Examples thereof may include "percumyl D" available from NOF corporation.

The content of the curing accelerator in the resin composition is not particularly limited and is preferably 0.01% by mass to 3% by mass when the nonvolatile components in the epoxy resin and the curing agent are determined to be 100% by mass.

(F) Flame Retardant

The resin composition of the present invention may further contain (F) a flame retardant. Examples of the flame retardant may include an organic phosphorus-based flame retardant, an organic nitrogen-containing phosphorus compound, a nitrogen compound, a silicone-based flame retardant, and metal hydroxide. The flame retardant may be used alone or in combination of two or more kinds thereof.

As the flame retardant, a commercially available product may be used. Examples thereof may include "HCA-HQ" available from Sanko Co., Ltd., and "PX-200" available from Daihachi Chemical Industry Co., Ltd. As the flame retardant, flame retardants that are difficult to be hydrolyzed are preferable and, for example, 10-(2,5-dihydroxyphenyl)-10-hydro-9-oxa-10-phosphaphenanthrene-10-oxide and the like are preferable.

When the resin composition includes the flame retardant, the content of the flame retardant is not particularly limited and is preferably 0.5% by mass to 20% by mass, more preferably 0.5% by mass to 15% by mass, and further preferably 0.5% by mass to 10% by mass.

(G) Organic Filler

The resin composition may contain (G) an organic filler from the viewpoint of improving a tensile breaking strength of a cured product of the resin composition layer. As the organic filler, any organic filler that may be used for forming an insulating layer of a printed wiring board may be used.

Examples thereof may include rubber particles, polyamide fine particles, and silicone particles.

As the rubber particles, commercially available products may be used. Examples thereof may include "EXL2655" available from Dow Chemical Japan Ltd. and "AC3401N" and "AC3816N" available from Aica Kogyo Company, Limited.

For example, "AC3816N" and "AC3401N" available from Aica Kogyo Company, Limited are preferable as the rubber particles from the viewpoint of providing a low ionic property and allowing an extracted water conductivity of a cured product of the resin composition layer to be lowered.

When the resin composition includes the organic filler, the content of the organic filler is preferably 0.1% by mass to 20% by mass, more preferably 0.2% by mass to 10% by mass, further preferably 0.3% by mass to 5% by mass or 0.5% by mass to 3% by mass.

(H) Other Additives

The resin composition may further contain other additive, if necessary. Examples of the other additive may include an organometallic compound such as an organic copper compound, an organic zinc compound, and an organic cobalt compound, and a resin additive such as a thickener, an antifoaming agent, a leveling agent, an adhesion-imparting agent, and a coloring agent.

The resin sheet of the present invention provides an insulating layer (a cured product of a resin composition layer) having excellent thin film insulating properties. Therefore, the resin sheet of the present invention can be suitably used as a resin sheet in order to form an insulating layer of a printed wiring board (for forming an insulating layer of a printed wiring board) and can be more suitably used as a resin sheet in order to form an interlayer insulating layer of a printed wiring board (a resin sheet for an interlayer insulating layer of a printed wiring board). For example, in a printed wiring board including a first conductive layer, a second conductive layer, and an insulating layer provided between the first conductive layer and the second conductive layer, excellent insulating property can be achieved even when a thickness of the insulating layer between the first and the second conductive layers is 6 μm or less (preferably 5.5 μm or less and more preferably 5 μm or less) by forming the insulating layer using the resin sheet of the present invention. In a preferred embodiment, the resin sheet of the present invention is used for forming an insulating layer of a printed wiring board including a first conductive layer, a second conductive layer, and the insulating layer that insulates the first conductive layer from the second conductive layer and has a thickness of 6 μm or less between the first conductive layer and the second conductive layer.

Resin Sheet

The resin sheet of the present invention includes a support and a resin composition layer provided on the support. The resin composition layer is formed from the resin composition.

The thickness of the resin composition layer is preferably 15 μm or less, more preferably 12 μm or less, further preferably 10 μm or less, and further more preferably 8 μm or less from the viewpoint of making the thickness of the printed wiring board thinner. The lower limit of the thickness of the resin composition layer is not particularly limited and may be determined to be usually 1 μm or more, 1.5 μm or more, or 2 μm or more.

Examples of the support may include a film of a plastic material, a metal foil, and a release paper. The film of a plastic material and the metal foil is preferable.

When the film of a plastic material is used as the support, examples of the plastic material may include polyester such as polyethylene terephthalate (hereinafter may be abbreviated as "PET") and polyethylene naphthalate (hereinafter may be abbreviated as "PEN"), polycarbonate (hereinafter may be abbreviated as "PC"), acryl such as polymethyl methacrylate (PMMA), cyclic polyolefin, triacetyl cellulose (TAC), polyether sulfide (PES), polyether ketone, and polyimide. Among them, polyethylene terephthalate and polyethylene naphthalate are preferable, and inexpensive polyethylene terephthalate is particularly preferable.

When the metal foil is used as the support, examples of the metal foil may include a copper foil and an aluminum foil. The copper foil is preferable. As the copper foil, a foil made of a single metal of copper may be used. Alternatively, a foil made of an alloy of copper and another metal (for example, tin, chromium, silver, magnesium, nickel, zirconium, silicon, or titanium) may be used.

A surface of the support which is to be in contact with the resin composition layer may be subjected to a mat treatment, a corona treatment or an antistatic treatment.

As the support, a support with a release layer which has a release layer on a surface to be in contact with the resin composition layer may be used. Examples of a release agent used for the release layer of the support with a release layer may include one or more release agents selected from the group consisting of an alkyd resin, a polyolefin resin, a urethane resin, and a silicone resin. As the support with a release layer, a commercially available product may be used. Examples thereof may include "SK-1," "AL-5," and "AL-7" available from Lintec Corporation and "Lumirror T6AM" and "Lumirror R80" available from Toray Industries, Inc., which are PET films with a release layer containing an alkyd resin-based release agent as a main component.

The thickness of the support is not particularly limited, and is preferably in a range of 5 μm to 75 μm and more preferably in a range of 10 μm to 60 μm. When the support with a release layer is used, it is preferable that the total thickness of the support with a release layer falls within the above-described range.

The resin sheet can be produced, for example, by preparing a resin varnish in which a resin composition is dissolved in an organic solvent, applying the resin varnish to the support using a die coater or the like, and drying the resin varnish to form the resin composition layer.

Examples of the organic solvent may include ketones such as acetone, methyl ethyl ketone (MEK), and cyclohexanone, acetate esters such as ethyl acetate, butyl acetate, cellosolve acetate, propylene glycol monomethyl ether acetate, and carbitol acetate, carbitols such as cellosolve and butyl carbitol, aromatic hydrocarbons such as toluene and xylene, and amide-based solvents such as dimethylforamide, dimethylacetamide (DMAc), and N-methyl pyrrolidone. The organic solvent may be used alone or in combination of two or more kinds thereof.

The resin varnish may be dried by a publicly known method such as heating and blowing hot air. Although a drying condition is not particularly limited, the resin varnish is dried so that the content of the organic solvent in the resin composition layer is 10% by mass or less, and preferably 5% by mass or less. When, for example, a resin varnish containing 30% by mass to 60% by mass of organic solvent is used, the resin varnish is dried at 50° C. to 150° C. for 3 minutes to 10 minutes, whereby a resin composition layer can be formed. However, these conditions vary depending on the boiling point of the solvent in the resin varnish.

In the resin sheet, a protection film that is similar to the support can be further laminated onto a surface of the resin composition layer that is not in contact with the support (that is, a surface on a side opposite to the support). The thickness of the protection film is not particularly limited and is, for example, 1 μm to 40 μm. By laminating the protection film, adhesion of dust or the like or occurrence of scratch on the surface of the resin composition layer can be prevented. The resin sheet can be wound into a roll form and stored. When the resin sheet has a protection film, the resin sheet can be used by peeling off the protection film.

The lowest melt viscosity of the resin composition layer in the resin sheet is preferably 12,000 poise (1,200 Pa·s) or less, more preferably 10,000 poise (1,000 Pa·s) or less, and further preferably 8,000 poise (800 Pa·S) or less, 5,000 poise (500 Pa·s) or less, or 4,000 poise (400 Pa·s) or less from the viewpoint of obtaining an excellent circuit embeddability. The lower limit of the lowest melt viscosity is preferably 1,000 poise (100 Pa·s) or more, more preferably 1,500 poise (150 Pa·s) or more, and further preferably 2,000 poise (200 Pa·s) or more from the viewpoint of stably maintaining a thickness even when the resin composition layer is thin.

The lowest melt viscosity of the resin composition layer is the lowest viscosity of the resin composition layer when the resin of the resin composition layer is melted. Specifically, when the resin composition layer is heated at a constant rate of temperature rise to melt the resin, the melt viscosity is decreased with increasing temperature at an initial stage and then the melt viscosity is increased with increasing temperature as the temperature becomes higher than a certain level. The lowest melt viscosity is a melt viscosity at the time when the melt viscosity becomes a minimum. The lowest melt viscosity of the resin composition layer can be measured by a dynamic viscoelasticity method, for example, in accordance with the method described in "Measurement of lowest melt viscosity" described below.

Cured Product

The cured product obtained by thermally curing the resin composition layer of the resin sheet of the present invention satisfies at least one of a specific extracted water conductivity (Property 1) and a specific ratio of a tensile breaking strength (Property 2). The present invention can provide an insulating layer having excellent thin layer insulating property since a cured product of the resin composition layer of the present invention satisfies the following properties.

Property 1

An extracted water conductivity A of a cured product of the resin composition layer when extracted at 120° C. for 20 hours is 50 μS/cm or less and an extracted water conductivity B of a cured product of the resin composition layer when extracted at 160° C. for 20 hours is 200 μS/cm or less.

Property 2

A ratio (B/A) of a tensile breaking strength B of a 10 μm thickness cured product of the resin composition layer after HAST test to a tensile breaking strength A of a 10 μm thickness cured product of the resin composition layer is 0.65 or more and 1 or less.

The cured product of the resin composition layer satisfying Property 1 can be obtained by using a resin having high purity, using a resin difficult to be hydrolyzed, or using a resin having high heat resistance for the components contained in the resin composition (for example, the epoxy resin and the curing agent), or adjusting an amount of the inorganic filler.

The cured product of the resin composition layer satisfying Property 2 can be obtained by using a resin having high purity, using a resin difficult to be hydrolyzed, or using a resin having high heat resistance for the components contained in the resin composition (for example, the epoxy resin and the curing agent), or adjusting an amount of the inorganic filler.

In the present invention, an insulating layer having excellent thin film insulating properties can be provided as long as a cured product of the resin composition layer satisfies any one of Property 1 and Property 2. The cured product of the resin composition layer having both of Property 1 and Property 2, however, is preferable because it can provide an insulating layer having more excellent thin film insulating properties.

The thermal curing condition of resin composition layer of the resin sheet of the present invention is not particularly limited. For example, the condition usually employed in formation of an insulating layer of a printed wiring board described below may be used. The resin composition may be preheated before thermal curing. The heat treatment including the preheating may be carried out several times in the thermal curing condition. In an example of the thermal curing condition, the resin composition is thermally cured firstly at 100° C. for 30 minutes, then at 175° C. for 30 minutes, and further at 190° C. for 90 minutes.

From the viewpoint of providing an insulating layer having excellent thin film insulating property, an extracted water conductivity A of a cured product (for example, a cured product obtained by thermally curing the resin composition layer at 100° C. for 30 minutes, then at 175° C. for 30 minutes, and further at 190° C. for 90 minutes) of the resin composition layer of the present resin sheet when extracted at 120° C. for 20 hours is 50 μS/cm or less and an extracted water conductivity B of a cured product of the resin composition layer when extracted at 160° C. for 20 hours is 200 μS/cm or less. The extracted water conductivity A is preferably 47 μS/cm or less, more preferably 45 μS/cm or less, and further preferably 43 μS/cm or less. The extracted water conductivity B is preferably 195 μS/cm or less, more preferably 190 μS/cm or less, and further preferably 185 μS/cm or less from the viewpoint of achieving an insulating layer having excellent thin film insulating property. The extracted water conductivity A of a cured product of the resin composition layer when extracted at 120° C. for 20 hours and the extracted water conductivity B of a cured product of the resin composition layer when extracted at 160° C. for 20 hours can be measured in accordance with the method described in "Measurement of extracted water conductivity of cured product" mentioned below.

A glass transition temperature (measured by DMA) of a cured product (for example, a cured product obtained by thermally curing the resin composition layer at 100° C. for 30 minutes, then at 175° C. for 30 minutes, and further at 190° C. for 90 minutes) of the resin composition layer of the present resin sheet is preferably 160° C. or more, more preferably 170° C. or more, and further preferably 180° C. or more from the viewpoint of allowing the extracted water conductivity of a cured product of the resin composition layer to be easily lowered and suppressing deterioration in the tensile breaking strength when the cured product of the resin composition layer is placed under a high-temperature and high-humidity environment. The glass transition temperature of a cured product of the resin composition layer can be measured, for example, in accordance with the method described in "Measurement of glass transition temperature of cured product".

A tensile breaking strength A of a 10 μm thickness cured product (for example, a cured product obtained by thermally curing the resin composition layer at 100° C. for 30 minutes, then at 175° C. for 30 minutes and, further at 190° C. for 90 minutes) of the resin composition layer of the present resin sheet is preferably 50 MPa or more, more preferably 60 MPa or more, and further preferably 70 MPa or more from the viewpoint of achieving an insulating layer having an excellent thin film insulating property. The upper limit of the tensile breaking strength A is not particularly limited and may be, for example, 150 MPa or less, 140 MPa or less, 130 MPa or less, 120 MPa or less, or 110 MPa or less.

A tensile breaking strength B after a HAST test of a 10 μm thickness cured product (for example, a cured product obtained by thermally curing the resin composition layer at 100° C. for 30 minutes, then at 175° C. for 30 minutes, and further at 190° C. for 90 minutes) of the resin composition layer of the present resin sheet is preferably 50 MPa or more, more preferably 55 MPa or more, further preferably 60 MPa or more, and further more preferably 70 MPa or more from the viewpoint of achieving an insulating layer having excellent thin film insulating properties. The upper limit of the tensile breaking strength B is not particularly limited and may be, for example, 150 MPa or less, 140 MPa or less, 130 MPa or less, 120 MPa or less, or 110 MPa or less. In the present invention, the HAST (Highly Accelerated temperature and humidity Stress Test) test can be carried out, for example, by using a highly accelerated life test apparatus ("PM422" manufactured by ETAC Engineering Co., Ltd.) and subjecting a cured product of the resin composition layer to the condition of a relative humidity of 85% at 130° C. for 100 hours.

In the present invention, the ratio (B/A) of the tensile breaking strength B to the tensile breaking strength A is preferably 0.65 or more, more preferably 0.68 or more, and further preferably 0.70 or more from the viewpoint of achieving an insulating layer having excellent thin film insulating property. The ratio (B/A) of the tensile breaking strength B to the tensile breaking strength A is preferably 1 or less, more preferably 0.9 or less, and further preferably 0.8 or less from the viewpoint of achieving an insulating layer having excellent thin film insulating property.

For cured products of the resin composition layer of the present resin sheet, the tensile breaking strength A of a 10 μm thickness cured product and the tensile breaking strength B after a HAST test of a 10 μm thickness cured product can be measured, for example, in accordance with the method described in "Measurement of tensile breaking strength of cured product" noted below. The ratio (B/A) of the tensile breaking strength B to the tensile breaking strength A can be calculated using the measured values obtained by the measurement.

The cured product obtained by thermally curing the resin composition layer of the present resin sheet (for example, a cured product obtained by thermally curing the resin composition at 100° C. for 30 minutes and then at 175° C. for 30 minutes) exhibits an excellent insulation resistance value even after subjected to the environment of 130° C., 85 RH %, and 3.3 V application for 100 hours. In other words, the cured product provides an insulating layer exhibiting excellent insulation resistance value. The upper limit of the insulation resistance value is preferably $10^{12} \Omega$ or less, more preferably $10^{11} \Omega$ or less, and further preferably $10^{10} \Omega$ or less. The lower limit is not particularly limited and is preferably $10^{6} \Omega$ or more and more preferably $10^{7} \Omega$ or more. The insulation resistance value can be measured in accordance with the method described in "Evaluation of insulation reliability and measurement of thickness of insulating layer between conductive layer" noted below.

The present invention also includes a cured product of the resin composition layer in which the extracted water conductivity A when extracted at 120° C. for 20 hours is 50 μS/cm or less and the extracted water conductivity B when extracted at 160° C. for 20 hours is 200 μS/cm or less. The cured product has the same configuration as the cured product of the resin composition layer of the resin sheet of the present invention. The curing condition of the resin composition for forming the cured product is the same as the curing condition of the resin sheet. In the cured product of the present invention (for example, a cured product obtained by thermally curing the resin composition layer at 100° C. for 30 minutes, then at 175° C. for 30 minutes, and further at 190° C. for 90 minutes), the preferable range of the extracted water conductivity A and the preferable range of the extracted water conductivity B are the same as those of the cured product of the resin sheet described above. The preferable ranges of the other physical properties than the extracted water conductivity of the cured product (a glass transition temperature, a tensile breaking strength A, a tensile breaking strength B, a ratio of the tensile breaking strength B to the tensile breaking strength A (B/A), and an insulation resistance value) are also the same as those of the cured products of the resin sheet described above.

Printed wiring board and method for producing the same

The printed wiring board of the present invention includes an insulating layer formed of a cured product of the resin composition layer of the present resin sheet, a first conductive layer, and a second conductive layer. The printed wiring board of the present invention may include the cured product of the present invention as the insulating layer. The insulating layer is provided between the first conductive layer and the second conductive layer and insulates the first conductive layer from the second conductive layer (the conductive layers are also referred to as wiring layers). The insulating layer formed of the cured product of the resin composition layer of the present resin sheet has excellent thin film insulating property, and thus exhibits excellent insulating property even when a thickness of the insulating layer between the first and second conductive layers is 6 μm or less.

The thickness of the insulating layer between the first and second conductive layers is preferably 6 μm or less, more preferably 5.5 μm or less, and further preferably 5 μm or less. The lower limit thereof is not particularly limited and may be 0.1 μm or more. As exemplarily illustrated in FIG. 1, the thickness of the insulating layer between the first and second conductive layers means a thickness t1 of an insulating layer 7 between a main surface 51 of a first conductive layer 5 and a main surface 61 of a second conductive layer 6. The first and second conductive layers are adjacent conductive layers with the insulating layer interposed therebetween and the main surface 51 and the main surface 61 are opposed to each other. The thickness of the insulating layer between the first and second conductive layers can be measured in accordance with the method described in "Evaluation of insulation reliability and measurement of thickness of insulating layer between conductive layers" noted below.

The thickness t2 of the entire insulating layer is preferably 20 μm or less, more preferably 15 μm or less, and further preferably 12 μm or less. The lower limit thereof is not particularly limited and may be 1 μm or more.

The printed wiring board of the present invention can be produced by a method including the following steps (I) and (II) using the resin sheet described above:

(I) laminating the resin sheet on an internal layer substrate so that the resin composition layer of the resin sheet is in contact with the internal layer substrate; and (II) thermally curing the resin composition layer to form an insulating layer The "internal layer substrate" used in the step (I) refers mainly to: a substrate such as a glass epoxy substrate, a metal substrate, a polyester substrate, a polyimide substrate, a BT resin substrate and a thermosetting polyphenylene ether substrate; and a circuit substrate in which a patterned conductive layer (circuit) is formed on one side or both sides of the above substrate. The "internal layer substrate" in the present invention also includes an internal layer circuit substrate that is an intermediate product on which an insulating layer and/or a conductive layer is further to be formed in the production of a printed wiring board. In a case where the printed wiring board is a device-embedded circuit board, an internal layer substrate including a device embedded therein may be used.

The lamination of the resin sheet and the internal layer substrate can be carried out by, for example, thermal pressing the resin sheet to the internal layer substrate from the support side. Examples of a member used for thermal pressing the resin sheet to the internal layer substrate (hereinafter referred to as a "thermal pressing member") may include a heated metal plate such as a stainless (SUS) flat panel and a heated metal roll (SUS roll). The thermal pressing member is preferably pressed against the resin sheet in a state that an elastic material such as heat resistant rubber intervenes there-between so as to allowing the resin sheet to sufficiently follow the surface irregularities of the internal layer substrate, instead of directly pressing the thermal pressing member against the resin sheet.

The lamination of the internal layer substrate and the resin sheet may be carried out by a vacuum lamination method. In the vacuum lamination method, the thermal pressing temperature is preferably in a range of 60° C. to 160° C. and more preferably in a range of 80° C. to 140° C., the thermal pressing pressure is preferably in a range of 0.098 MPa to 1.77 MPa and more preferably in a range of 0.29 MPa to 1.47 MPa, and the thermal pressing time is preferably in a range of 20 seconds to 400 seconds and more preferably in a range of 30 seconds to 300 seconds. It is preferable that the lamination is carried out under a reduced pressure condition of 26.7 hPa or less.

The lamination can be carried out by a commercially available vacuum laminator. Examples of the commercially available vacuum laminator may include a vacuum pressure laminator manufactured by MEIKI CO., LTD. and a vacuum applicator manufactured by Nikko Materials Co., Ltd.

After the lamination, the laminated resin sheet may be subjected to a smoothing treatment, for example, by pressing the thermally pressing member from the support side under normal pressure (atmospheric pressure). A pressing condition for the smoothing treatment may be the same as the thermal pressing condition for the lamination described above. In the smoothing treatment, a commercially available vacuum laminator may be used. The laminating and the smoothing treatment may be performed continuously using the commercially available vacuum laminator.

The support may be removed between the step (I) and the step (II) or may be removed after the step (II).

In the step (II), the resin composition layer is thermally cured to form an insulating layer.

The condition for thermal curing of the resin composition layer is not particularly limited. The condition may be a condition that is usually employed in formation of an insulating layer of a printed wiring board.

A condition for thermally curing the resin composition layer varies depending on the type of the resin composition and the like. For example, the curing temperature is in a range of 120° C. to 240° C. (preferably in a range of 150° C. to 220° C. and more preferably in a range of 170° C. to 200° C.) and the curing time is in a range of 5 minutes to 120 minutes (preferably 10 minutes to 100 minutes and more preferably 15 minutes to 90 minutes).

Before thermally curing the resin composition layer, the resin composition layer may be preheated at a temperature lower than the curing temperature. For example, before thermally curing the resin composition layer, the resin composition layer may be preheated at a temperature of 50° C. or more and less than 120° C. (preferably 60° C. or more and 110° C. or less and more preferably 70° C. or more and 100° C. or less) for 5 minutes or more (preferably 5 minutes to 150 minutes and more preferably 15 minutes to 120 minutes).

When a printed wiring board is produced, a step (III) of perforating the insulating layer, a step (IV) of roughening the insulating layer, and a step (V) of forming the conductive layer may be further performed. These steps (III) to (V) may be performed by any methods that are known to those skilled in the art in the production of a printed wiring board. When the support is removed after the step (II), removal of the support may be carried out between the step (II) and the step (III), between the step (III) and the step (IV), or between the step (IV) and the step (V). The formation of the insulating layer and the conductive layer of the steps (II) to (V) may be repeated to form a multilayer wiring board, if necessary. In this case, it is preferable that the thickness (t1 in FIG. 1) of each insulating layer between the conductive layers falls within the above range.

The step (III) is a step of perforating the insulating layer, whereby holes such as via holes and through holes can be formed in the insulating layer. The step (III) may be performed using, for example, a drill, laser, or plasma depending on the composition of the resin composition used for forming the insulating layer or the like. The size and shape of the hole may be appropriately determined in accordance with the design of the printed wiring board.

The step (IV) is a step of roughening the insulating layer. The procedure and condition for roughening are not particularly limited, and publicly known procedure and condition that are generally used in formation of an insulating layer of a printed wiring board may be used. In the step (IV), the insulating layer may be roughened by a swelling treatment with a swelling solution, a roughening treatment with an oxidant, and a neutralization treatment with a neutralization solution in this order. The swelling solution is not particularly limited, and examples thereof may include an alkaline solution and a surfactant solution. An alkaline solution is preferable. As the alkaline solution, a sodium hydroxide solution and a potassium hydroxide solution are preferable. Examples of a commercially available swelling solution may include "Swelling Dip Securiganth P" and "Swelling Dip Securiganth SBU" available from Atotech Japan K. K. The swelling treatment with the swelling solution is not particularly limited, and for example, can be performed by immersing the insulating layer into the swelling solution at 30° C. to 90° C. for 1 minute to 20 minutes. From the viewpoint of controlling the swelling of resin in the insulating layer to an appropriate level, it is preferable to immerse the insulating layer into the swelling liquid at 40° C. to 80° C. for 5 minutes to 15 minutes. The oxidant is not particularly limited, and examples thereof may include an alkaline permanganate solution in which potassium permanganate or sodium permanganate is dissolved in an aqueous solution of sodium hydroxide. The roughening treatment with the oxidant such as the alkaline permanganate solution is preferably performed by immersing the insulating layer into an oxidant solution that is heated at 60° C. to 80° C. for 10 minutes to 30 minutes. The concentration of permanganate in the alkaline permanganate solution is preferably 5% by mass to 10% by mass. Examples of a commercially available oxidant may include an alkaline permanganate solution such as "Concentrate Compact CP" and "Dosing Solution Securiganth P" available from Atotech Japan K.K. It is preferable that the neutralization solution be an acidic aqueous solution. Examples of a commercially available product may include "Reduction Solution Securiganth P" available from Atotech Japan K.K. The treatment with the neutralization solution may be performed by immersing the insulating layer a surface of which has been roughened with the oxidant solution into the neutralization solution at 30° C. to 80° C. for 5 minutes to 30 minutes. From the viewpoint of workability and the like, a method of immersing the object that has been subjected to the roughening treatment with the oxidizing agent into the neutralizing liquid at 40° C. to 70° C. for 5 minutes to 20 minutes is preferable.

In one embodiment, the arithmetic mean roughness Ra of a surface of the insulating layer after the roughening treatment is preferably 400 nm or less, more preferably 350 nm or less, further preferably 300 nm or less, 250 nm or less, 200 nm or less, 150 nm or less, or 100 nm or less. The arithmetic mean roughness (Ra) of a surface of the insulating layer can be measured using a non-contact type surface roughness meter. Specific examples of the non-contact type surface roughness meter may include "WYKO NT3300" manufactured by Veeco Instruments Inc.

The step (V) is a step of forming a conductive layer. When a conductive layer is not formed on the internal layer substrate, the step (V) is a step of forming the first conductive layer. On the other hand, when a conductive layer is formed on the internal layer substrate, the conductive layer is the first conductive layer and the step (V) is a step of forming a second conductive layer.

A conductive material used for the conductive layer is not particularly limited. In a preferred embodiment, the conductive layer includes one or more metals selected from the group consisting of gold, platinum, palladium, silver, copper, aluminum, cobalt, chromium, zinc, nickel, titanium, tungsten, iron, tin, and indium. The conductive layer may be a single metal layer or an alloy layer. Examples of the alloy layer may include layers formed of an alloy of two or more metals selected from the above-described group such as a nickel-chromium alloy, a copper-nickel alloy, and a copper-titanium alloy. In particular, from the viewpoints of versatility of formation of the conductive layer, cost, and ease of patterning, the conductive layer is preferably a single metal layer of chromium, nickel, titanium, aluminum, zinc, gold, palladium, silver or copper, or an alloy layer of a nickel-chromium alloy, a copper-nickel alloy or a copper-titanium alloy; more preferably a single metal layer of chromium, nickel, titanium, aluminum, zinc, gold, palladium, silver or copper, or an alloy layer of a nickel-chromium alloy; and further preferably a single metal layer of copper.

The conductive layer may have a single-layer structure or a multi-layer structure in which two or more layers of single metal layer or alloy layer formed of different kinds of metals or alloys are layered. When the conductive layer has a multi-layer structure, it is preferable that a layer in contact with the insulating layer be a single metal layer of chromium, zinc or titanium or an alloy layer of nickel-chromium alloy.

The thickness of the conductive layer varies depending on a desired design of a printed wiring board, and is generally 3 µm to 35 µm, and preferably 5 µm to 30 µm.

In one embodiment, the conductive layer may be formed by plating. For example, a conductive layer having a desired wiring pattern can be formed by plating the surface of the insulating layer through a conventionally known technique such as a semi-additive method and a full-additive method. Hereinafter, an example of forming the conductive layer by the semi-additive method will be described.

Firstly, a plating seed layer is formed on the surface of the insulating layer by electroless plating. Subsequently, onto the formed plating seed layer, a mask pattern is formed that exposes a portion of the plating seed layer corresponding to a desired wiring pattern. A metal layer is formed on the exposed plating seed layer by electrolytic plating, and then the mask pattern is removed. After that, an unnecessary plating seed layer can be removed by etching or the like to form a conductive layer having a desired wiring pattern.

The resin sheet of the present invention provides an insulating layer excellent in device embeddability and thus can be suitably used even when a printed wiring board is a device-embedded circuit board. The device-embedded circuit board can be produced by a known production method.

In one embodiment, the printed wiring board produced using the resin sheet of the present invention may include an insulating layer that is a cured product of the resin composition layer of the present resin sheet and an embedded type wiring layer embedded in the insulating layer.

The printed wiring board produced by using the resin sheet of the present invention is characterized in that it can exhibit excellent insulation reliability even when the thickness of the insulating layer between the first and second conductive layers is 6 µm or less. The upper limit of the insulation resistance value after 100 hours under the condition of 130° C., 85 RH %, and 3.3 V application is preferably $10^{12} \Omega$ or less, more preferably $10^{11} \Omega$ or less, and further preferably $10^{10} \Omega$ or less. The lower limit thereof is not particularly limited and is preferably $10^{6} \Omega$ or more, and more preferably $10^{7} \Omega$ or more. The insulation resistance value can be measured in accordance with the method described in "Evaluation of insulation reliability and measurement of thickness of insulating layer between conductive layers" noted below.

Semiconductor Device

The semiconductor device of the present invention includes the printed wiring board of the present invention. The semiconductor device of the present invention can be produced using the printed wiring board of the present invention.

Examples of the semiconductor device may include various semiconductor devices used in electrical products such as a computer, a cellular phone, a digital camera and a television, and vehicles such as a motorcycle, an automobile, a train, a ship and an airplane.

The semiconductor device of the present invention can be produced by mounting a part (semiconductor chip) on a conducting part of the printed wiring board. The "conducting part" is a "part for conducting an electric signal in the printed wiring board," which may be positioned on a surface or an embedded part. The semiconductor chip is not particularly limited as long as it is an electric circuit element made of a semiconductor as a material.

A method for mounting the semiconductor chip in production of the semiconductor device of the present invention is not particularly limited as long as the semiconductor chip effectively functions. Specific examples of the method may include a wire bonding mounting method, a flip-chip mounting method, a mounting method using a bumpless build-up layer (BBUL), a mounting method using an anisotropic conductive film (ACF), and a mounting method using a non-conductive film (NCF). The "method of mounting by bumpless build-up layer (BBUL)" is "a mounting method in which a semiconductor chip is embedded directly in a concave portion of a printed wiring board, followed by connecting the semiconductor chip to the wiring on the printed wiring board."

Other features of the invention will become apparent in the course of the following descriptions of exemplary embodiments which are given for illustration of the invention and are not intended to be limiting thereof.

EXAMPLES

In the following description, "part" and "%" represent "part by mass" and "% by mass", respectively, unless otherwise specified.

Measuring Method of Physical Properties of Inorganic Filler

First, there will be described the method of measuring the physical properties of the inorganic filler used in Examples and Comparative Examples.

Measurement of Average Particle Diameter 100 mg of an inorganic filler, 0.1 g of a dispersing agent ("SN9228" available from SAN NOPCO LIMITED), and 10 g of methyl ethyl ketone were weighed in a vial bottle and dispersed by ultrasonication for 20 minutes. The average particle diameter based on a median diameter was calculated by measuring the particle size distribution in a batch cell method using a laser diffraction type particle size distribution measuring device ("SALD-2200" manufactured by Shimadzu Corporation).

Measurement of Specific Surface Area

The specific surface area of the inorganic filler was measured using a BET full automatic specific surface area measuring apparatus ("Macsorb HM-1210" manufactured by Mountech Co., Ltd.).

Measurement of True Density

The true density of the inorganic filler was measured using Micro Ultra-Pycnometer ("MUPY-21T", manufactured by Quantachrome Instruments Japan G. K.).

Measurement of Carbon Amount

The amount of carbon per unit surface area of the inorganic filler was measured in accordance with the following procedure. A sufficient amount of MEK as a solvent was added to the inorganic filler prepared in Preparation Examples and washed with ultrasonication at 25° C. for 5 minutes. Subsequently, the supernatant was removed and the solid content was dried. The amount of carbon of the obtained solid was measured using a carbon analyzer ("EMIA-320" manufactured by HORIBA, Ltd.). The amount of carbon per unit surface area of the inorganic filler was calculated based on the measured amount of carbon and the mass and specific surface area of inorganic filler used.

Preparation of Resin Sheet

A resin composition (also referred to as "resin varnish") used for producing a resin sheet was prepared in accordance with the following procedure to prepare a resin sheet of Examples and Comparative Examples.

Preparation of Resin Composition 1

4 Parts of a bisphenol A type epoxy resin ("YD-8125G", available from NIPPON STEEL & SUMIKIN CHEMICAL CO., LTD., epoxy equivalent weight: about 174), 6 parts of a bixylenol type epoxy resin ("YX4000HK", available from Mitsubishi Chemical Corporation, epoxy equivalent weight: about 185), 6 parts of a bisphenol AF type epoxy resin ("YL7760", available from Mitsubishi Chemical Corporation, epoxy equivalent weight: about 238), 18 parts of a biphenyl type epoxy resin ("NC3000L" available from Nippon Kayaku Co., Ltd., epoxy equivalent weight: about 272), 10 parts of a phenoxy resin ("YX7553BH30", available from Mitsubishi Chemical Corporation, a 1:1 solution of cyclohexanone:methyl ethyl ketone (MEK) having a solid content of 30% by mass) were heated and dissolved in a mixed solvent of 10 parts of solvent naphtha and 10 parts of cyclohexanone with stirring. After the resultant soliton was cooled to room temperature, 10 parts of a triazine skeleton-containing phenol novolac-based curing agent ("LA7052" available from DIC Corporation, hydroxyl equivalent weight: about 120, MEK solution having a solid content of 60%), 12 parts of naphthol-based curing agent ("SN-495V", available from NIPPON STEEL & SUMIKIN CHEMICAL CO., LTD., hydroxyl group equivalent weight: 231, a MEK solution having a solid content of 60%), 10 parts of a carbodiimide resin ("V-03", available from Nisshinbo Chemical Inc., carbodiimide equivalent weight: 216, a toluene solution having a nonvolatile component of 50% by mass), 1 part of an amine-based curing accelerator (4-dimethylaminopyridine (DMAP), a MEK solution having a solid content of 5% by mass), swollen rubber particles made by swelling 2 parts of rubber particles (AC-3401N, available from Aica Kogyo Company, Limited) in 10 parts of solvent naphtha at room temperature for 12 hours, and 110 parts of spherical silica ("SPH516-05", available from NIPPON STEEL & SUMIKIN MATERIALS CO., LTD., average particle diameter: 0.29 µm, specific surface area: 16.3 $m^2$/g, true density: 2.25 g/$cm^3$, product of specific surface area and true density: 36.7 ($m^2$·g/$cm^3$), carbon amount per unit surface area: 0.43 mg/$m^2$) surface-treated with an aminosilane-based coupling agent ("KBM573" available from Shin-Etsu Chemical Co., Ltd.) were mixed thereinto. The resultant mixture was homogeneously dispersed with a high-speed rotation mixer and thereafter filtrated with a cartridge filter ("SHP020" available from ROKI TECHNO CO., LTD.), thus preparing a resin composition 1.

Preparation of Resin Composition 2

4 Parts of a naphthalene type epoxy resin ("HP4032SS", available from DIC Corporation, epoxy equivalent weight: about 144), 8 parts of a naphthylene ether type epoxy resin ("EXA-7311-G", available from DIC Corporation, epoxy equivalent weight: about 213), 15 parts of a naphthalene type epoxy resin ("ESN475V", available from NIPPON STEEL & SUMIKIN CHEMICAL CO., LTD., epoxy equivalent weight: about 330), and 6 parts of a phenoxy resin ("YX7553BH30", available from Mitsubishi Chemical Corporation, a 1:1 solution of cyclohexanone:methyl ethyl ketone (MEK) having a solid content of 30% by mass) were heated and dissolved in a mixed solvent of 15 parts of solvent naphtha and 10 parts of cyclohexanone with stirring. After the resultant solution was cooled to room temperature, 18 parts of a prepolymer of bisphenol A dicyanate ("BA230S75", available from Lonza Japan Co., Ltd., cyanate equivalent weight: about 232, a MEK solution having a nonvolatile content of 75% by mass), 10 parts of a multifunctional cyanate ester resin ("ULL-950S", available from Lonza Japan Co., Ltd., cyanate equivalent weight: about 230, a MEK solution having a nonvolatile content of 75% by mass), 6 parts of an active ester-based curing agent ("HPC-8000-65T", available from DIC Corporation, an active group equivalent weight: about 225, a toluene solution having a nonvolatile component of 65%), 0.4 part of an amine-based curing accelerator (4-dimethylaminopyridine (DMAP), a MEK solution having a solid content of 5% by mass), 3 parts of a curing accelerator (cobalt (III) acetylacetonate (Co (III) Ac), available from Tokyo Chemical Industry Co., Ltd., a MEK solution having a solid content of 1% by mass), and 90 parts of spherical silica ("SPH516-05", available from NIPPON STEEL & SUMIKIN MATERIALS CO., LTD., average particle diameter: 0.29 µm, specific surface area: 16.3 m$^2$/g, true density: 2.25 g/cm$^3$, product of specific surface area and true density: 36.7 (m$^2$/g·g/cm$^3$), carbon amount per unit surface area: 0.43 mg/m$^2$) surface-treated with an aminosilane-based coupling agent ("KBM573" available from Shin-Etsu Chemical Co., Ltd.) were mixed thereinto. The resultant mixture was homogeneously dispersed with a high-speed rotation mixer and thereafter filtrated with a cartridge filter ("SHP020" available from ROKI TECHNO CO., LTD.), thus preparing a resin composition 2.

Preparation of Resin Composition 3

4 Parts of a glycidylamine type epoxy resin ("630LSD", available from Mitsubishi Chemical Corporation, epoxy equivalent weight: about 95), 5 parts of a bixylenol type epoxy resin ("YX4000HK", available from Mitsubishi Chemical Corporation, epoxy equivalent weight: about 185), 5 parts of a naphthylene ether type epoxy resin ("EXA-7311-G4", available from DIC Corporation, epoxy equivalent weight: about 213), 15 parts of a biphenyl type epoxy resin ("NC3000L" available from Nippon Kayaku Co., Ltd., epoxy equivalent weight: about 272), and 10 parts of a phenoxy resin ("YX7553BH30", available from Mitsubishi Chemical Corporation, a 1:1 solution of cyclohexanone:methyl ethyl ketone (MEK) having a solid content of 30% by mass) were heated and dissolved in a mixed solvent of 15 parts of solvent naphtha and 10 parts of cyclohexanone with stirring. After the resultant solution was cooled to room temperature, 5 parts of a triazine skeleton-containing cresol novolac-based curing agent ("LA3018-50P", available from DIC Corporation, hydroxyl equivalent weight: about 151, a 2-methoxypropanol solution having a solid content of 50%), 15 parts of an active ester-based curing agent ("HPC-8000-65T", available from DIC Corporation, active group equivalent weight: about 225, a toluene solution having a nonvolatile component of 65% by mass), 1.5 parts of an amine-based curing accelerator (4-dimethylaminopyridine (DMAP), a MEK solution having a solid content of 5% by mass), 2 parts of a flame retardant ("HCA-HQ", available from SANKO CO., LTD., 10-(2,5-dihydroxyphenyl)-10-hydro-9-oxa-10-phosphaphenanthrene-10-oxide, average particle size: 1.2 µm), and 110 parts of spherical silica ("SPH516-05", available from NIPPON STEEL & SUMIKIN MATERIALS CO., LTD., average particle diameter: 0.29 µm, specific surface area: 16.3 m$^2$/g, true density: 2.25 g/cm$^3$, product of specific surface area and true density: 36.7 (m$^2$/g·g/cm$^3$), carbon amount per unit surface area: 0.43 mg/m$^2$) surface-treated with an aminosilane-based coupling agent ("KBM573" available from Shin-Etsu Chemical Co., Ltd.) were mixed thereinto. The resultant mixture was homogeneously dispersed with a high-speed rotation mixer and thereafter filtrated with a cartridge filter ("SHP020" available from ROKI TECHNO CO., LTD.), thus preparing a resin composition 3.

Preparation of Resin Composition 4

8 Parts of a bisphenol A type epoxy resin ("828EL", available from Mitsubishi Chemical Corporation, epoxy equivalent weight: about 186), 6 parts of a bisphenol AF type epoxy resin ("YL7760", available from Mitsubishi Chemical Corporation, epoxy equivalent weight: about 238), 18 parts of a biphenyl type epoxy resin ("NC3000L" available from Nippon Kayaku Co., Ltd., epoxy equivalent weight: about 272), 10 parts of a phenoxy resin ("YX7553BH30", available from Mitsubishi Chemical Corporation, a 1:1 solution of cyclohexanone:methyl ethyl ketone (MEK) having a solid content of 30% by mass) were heated and dissolved in a mixed solvent of 5 parts of solvent naphtha and 10 parts of cyclohexanone with stirring. After the resultant solution was cooled to room temperature, 10 parts of a triazine skeleton-containing phenol novolac-based curing agent ("LA7052", available from DIC Corporation, hydroxyl equivalent weight: about 120, a MEK solution having a solid content of 60%), 12 parts of a naphthol-based curing agent ("SN-495V", available from NIPPON STEEL & SUMIKIN CHEMICAL CO., LTD., hydroxyl group equivalent weight: 231, a MEK solution having a solid content of 60%), 5 parts of a block type isocyanate resin ("BURNOCK D-500", available from DIC Corporation, an ethyl acetate solution having a nonvolatile component of 65% by mass), 1 part of an amine-based curing accelerator (4-dimethylaminopyridine (DMAP), a MEK solution having a solid content of 5% by mass), swollen rubber particles made by swelling 6 parts of rubber particles (AC-3355, available from Aica Kogyo Company, Limited) in 15 parts of solvent naphtha at room temperature for 12 hours, and 110 parts of spherical silica ("ADMAFINE SO-C1", available from Admatechs Company Limited, average particle diameter 0.63 µm, specific surface area 11.2 m$^2$/g, true density 2.25 g/cm$^3$, product of specific surface area and true density 25.2 (m$^2$/g·g/cm$^3$), amount of carbon per unit surface area 0.35 mg/m$^2$) treated its surface with an aminosilane-based coupling agent ("KBM573" available from Shin-Etsu Chemical Co., Ltd.) were mixed thereinto. The resultant mixture was homogeneously dispersed with a high-speed rotation mixer and thereafter filtrated with a cartridge filter ("SHP030" available from ROKI TECHNO CO., LTD.), thus preparing a resin composition 4.

Preparation of Resin Composition 5

4 Parts of a naphthalene type epoxy resin ("HP4032SS", available from DIC Corporation, epoxy equivalent weight: about 144), 8 parts of a bisphenol A type epoxy resin ("828EL", available from Mitsubishi Chemical Corporation, epoxy equivalent weight: about 186), 15 parts of a naphthalene type epoxy resin ("ESN475V", available from NIPPON STEEL & SUMIKIN CHEMICAL CO., LTD., epoxy equivalent weight: about 330), and 6 parts of a phenoxy resin ("YX7553BH30", available from Mitsubishi Chemical Corporation, a 1:1 solution of cyclohexanone:methylethyl ketone (MEK) having a solid content of 30% by mass) were heated and dissolved in a mixed solvent of 10 parts of solvent naphtha and 10 parts of cyclohexanone with stirring. After the resultant solution was cooled to room temperature, 18 parts of a prepolymer of bisphenol A dicyanate ("BA230S75", available from Lonza Japan Co., Ltd., cyanate equivalent weight: about 232, a MEK solution having a nonvolatile content of 75% by mass), 10 parts of a multifunctional cyanate ester resin ("ULL-950S", available from Lonza Japan Co., Ltd., cyanate equivalent weight: about 230, a MEK solution having a nonvolatile content of 75% by mass), 6 parts of a block type isocyanate resin ("BURNOCK D-500", available from DIC Corporation, an ethyl acetate solution having a nonvolatile component of 65% by mass), 0.4 part of an amine-based curing accelerator (4-dimethylaminopyridine (DMAP), a MEK solution having a solid content of 5% by mass), 3 parts of a curing accelerator (cobalt (III) acetylacetonate (Co(III) Ac), available from Tokyo Chemical Industry Co., Ltd., a MEK solution having a solid content of 1% by mass), 90 parts of spherical silica ("ADMAFINE SO-C1", available from Admatechs Company Limited, average particle diameter 0.63 μm, specific surface area 11.2 m$^2$/g, true density 2.25 g/cm$^3$, product of specific surface area and true density 25.2 (m$^2$/g·g/cm$^3$), amount of carbon per unit surface area 0.25 mg/m$^2$) surface-treated with an epoxysilane-based coupling agent ("KBM403" available from Shin-Etsu Chemical Co., Ltd.) were mixed thereinto. The resultant mixture was homogeneously dispersed with a high-speed rotation mixer and thereafter filtrated with a cartridge filter ("SHP030" available from ROKI TECHNO CO., LTD.), thus preparing a resin composition 5.

Preparation of Resin Composition 6

4 Parts of a bisphenol F type epoxy resin ("806L", available from Mitsubishi Chemical Corporation, epoxy equivalent weight: about 185), 5 parts of bixylenol type epoxy resin ("YX4000HK", available from Mitsubishi Chemical Corporation, epoxy equivalent weight: about 185), 5 parts of a naphthylene ether type epoxy resin ("EXA-7311-G4", available from DIC Corporation, epoxy equivalent weight: about 213), 15 parts of a biphenyl type epoxy resin ("NC3000L", available from Nippon Kayaku Co., Ltd., epoxy equivalent weight: about 272), 10 parts of a phenoxy resin ("YX7553BH30", available from Mitsubishi Chemical Corporation, a 1:1 solution of cyclohexanone: methyl ethyl ketone (MEK) having a solid content of 30% by mass), and 4 parts of a flame retardant ("PX-200", available from DAIHACHI CHEMICAL INDUSTRY CO., LTD.) were heated and dissolved in a mixed solvent of 15 parts of solvent naphtha and 10 parts of cyclohexanone with stirring. After the resultant solution was cooled to room temperature, 5 parts of a triazine skeleton-containing cresol novolac-based curing agent ("LA3018-50P", available from DIC Corporation, hydroxyl equivalent weight: about 151, a 2-methoxypropanol solution having a solid content of 50%), 15 parts of an active ester-based curing agent ("HPC-8000-65T", available from DIC Corporation, active group equivalent weight: about 225, a toluene solution having a nonvolatile component of 65% by mass), 1.5 part of an amine-based curing accelerator (4-dimethylaminopyridine (DMAP), a MEK solution having a solid content of 5% by mass), 110 parts of spherical silica ("ADMAFINE SO-C1", available from Admatechs Company Limited, average particle diameter 0.63 μm, specific surface area 11.2 m$^2$/g, true density 2.25 g/cm$^3$, product of specific surface area and true density 25.2 (m$^2$/g·g/cm$^3$), amount of carbon per unit surface area 0.35 mg/m$^2$) surface-treated with an aminosilane-based coupling agent ("KBM573" available from Shin-Etsu Chemical Co., Ltd.) were mixed thereinto. The resultant mixture was homogeneously dispersed with a high-speed rotation mixer and thereafter filtrated with a cartridge filter ("SHP030" available from ROKI TECHNO CO., LTD.), thus preparing a resin composition 6.

The components used in the resin compositions 1 to 6 and the blending amounts of the components (parts by mass of nonvolatile content) are listed in the following table.

TABLE 1

| In terms of nonvolatile component | | Resin composition 1 | 2 | 3 | 4 | 5 | 6 |
|---|---|---|---|---|---|---|---|
| Epoxy resin | HP4032SS | 0 | 4 | 0 | 0 | 4 | 0 |
| | YD-8125G | 4 | 0 | 0 | 0 | 0 | 0 |
| | 828EL | 0 | 0 | 0 | 8 | 8 | 0 |
| | 806L | 0 | 0 | 0 | 0 | 0 | 4 |
| | 630LSD | 0 | 0 | 4 | 0 | 0 | 0 |
| | NC3000L | 18 | 0 | 15 | 18 | 0 | 15 |
| | YX4000HK | 6 | 0 | 5 | 0 | 0 | 5 |
| | YL7760 | 6 | 0 | 0 | 6 | 0 | 0 |
| | EXA7311-G4 | 0 | 8 | 5 | 0 | 0 | 5 |
| | ESN-475V | 0 | 15 | 0 | 0 | 15 | 0 |
| Curing agent | HPC8000 | 0 | 3.9 | 9.75 | 0 | 0 | 9.75 |
| | LA3018 | 0 | 0 | 2.5 | 0 | 0 | 2.5 |
| | LA7052 | 6 | 0 | 0 | 6 | 0 | 0 |
| | SN-495V | 7.2 | 0 | 0 | 7.2 | 0 | 0 |
| | BA-230S | 0 | 13.5 | 0 | 0 | 13.5 | 0 |
| | ULL-950S | 0 | 7.5 | 0 | 0 | 7.5 | 0 |
| | V-03 | 5 | 0 | 0 | 0 | 0 | 0 |
| | BURNOCK D-500 | 0 | 0 | 0 | 3.25 | 3.9 | 0 |
| Inorganic filler | SPH516-05 | 110 | 90 | 110 | 0 | 0 | 0 |
| | SO-C1 | 0 | 0 | 0 | 0 | 90 | 0 |
| | SO-C1 | 0 | 0 | 0 | 110 | 0 | 110 |
| Phenoxy resin | YX7553BH30 | 3 | 1.8 | 3 | 3 | 1.8 | 3 |
| Curing accelerator | DMAP | 0.05 | 0.02 | 0.075 | 0.05 | 0.02 | 0.075 |
| | Co(III) | 0 | 0.03 | 0 | 0 | 0.03 | 0 |
| Flame retardant | PX-200 | 0 | 0 | 0 | 0 | 0 | 4 |
| | HCA-HQ | 0 | 0 | 2 | 0 | 0 | 0 |
| Rubber particle | AC-3401N | 2 | 0 | 0 | 0 | 0 | 0 |
| | AC-3355 | 0 | 0 | 0 | 6 | 0 | 0 |
| | Total | 167.25 | 143.75 | 156.325 | 167.5 | 143.75 | 158.325 |

Preparation of Resin Sheet of Examples 1-1 to 1-3 and Examples 2-1 to 2-3 and Resin Sheet of Comparative Examples 1-1 to 1-3 and Comparative Examples 2-1 to 2-3

As a support, a PET film ("Lumilar R80", available from Toray Industries, Inc., thickness 38 μm, softening point 130° C., "release PET") subjected to release treatment with an alkyd resin-based releasing agent ("AL-5" available from Lintec Corporation) was prepared.

Each of the resin compositions was uniformly applied onto the release PET with a die coater so that a thickness of resin composition layer after drying was 13 μm. The applied resin composition was dried at 70° C. to 95° C. for 2 minutes to form a resin composition layer on the release PET. Subsequently, a polypropylene film ("ALFAN MA-411", available from Oji F-Tex Co., Ltd., thickness 15 μm) as a protection film was laminated onto a surface of the resin composition layer that was not in contact with the support so that a rough surface of the protection film was in contact with the resin composition layer. Thus, a resin sheet including the support, the resin composition layer and the protection film in this order was obtained.

Separately, a resin sheet including the support, the resin composition layer having a thickness of 10 μm and the protection film in this order was prepared in a similar manner except that each resin composition was uniformly coated on the release PET with a die coater so that a thickness of the resin composition layer after drying was 10 μm.

Evaluation Test
Measurement of Lowest Melt Viscosity

For the resin sheets of Examples 1-1 to 1-3 and Examples 2-1 to 2-3 and the resin sheets of Comparative Examples 1-1 to 1-3 and Comparative Examples 2-1 to 2-3, the lowest melt viscosity was measured by the following method.

For the resin sheet including the resin composition layer having a thickness of 13 μm, only the resin composition layer was peeled off from the release PET (the support). The resultant resin composition layer was compressed with a mold, thus obtaining pellets for measurement (diameter 18 mm, 1.2 g to 1.3 g).

The lowest melt viscosities (poise) were calculated by measuring a dynamic viscoelasticity with a dynamic viscoelasticity measuring apparatus ("Rheosol-G3000" manufactured by UBM Co., Ltd.). For 1 g of the sample resin composition layer, the dynamic viscoelasticity was measured using a parallel plate having a diameter of 18 mm under conditions of a measurement temperature range of 60° C. onset to 200° C., a temperature rise rate of 5° C./min, a measurement temperature interval of 2.5° C., a frequency of 1 Hz, and a strain of 1 deg. The results are listed in Table 2 and Table 3.

Measurement of Glass Transition Temperature of Cured Product (Examples 1-1 to 1-3 and Comparative Examples 1-1 to 1-3)

The glass transition temperatures of the cured products of the resin composition layers of the resin sheets of Examples 1-1 to 1-3 and Comparative Examples 1-1 to 1-3 were measured by the following methods. A release PET film ("501010", available from Lintec Corporation, thickness 38 μm, 240 mm square) was placed on a double-sided copper clad layered body with an epoxy resin-glass cloth base material ("R5715ES", available from Matsushita Electric Works, Ltd., thickness 0.7 mm, 255 mm square) so that an untreated surface of the release PET film was in contact with the double-sided copper clad layered body. Then, four sides of the release PET film were fixed with a polyimide adhesive tape (width 10 mm).

Each of the resin sheets (200 mm square) including the resin composition layer having a thickness of 13 μm prepared in Examples and Comparative Examples was laminated onto the center of the release PET film ("501010", available from Lintec Corporation) so that the resin composition layer thereof was in contact with the release surface of the release PET film using a batch type vacuum pressure laminator (CVP700, manufactured by Nikko Materials Co., Ltd., a two stage build-up laminator). The lamination treatment was carried out by reducing the pressure for 30 seconds to an air pressure of 13 hPa or less and then pressing for 30 seconds at 100° C. and a pressure of 0.74 MPa.

Subsequently, the board was thermally cured for 30 minutes under a temperature condition of 100° C. after placing the board in an oven at 100° C., and then, for 30 minutes under a temperature condition of 175° C. after transferring the board to an oven at 175° C. Thereafter, the board was taken out under a room temperature atmosphere and the release PET (the support) was peeled off from the resin sheet. Thereafter, the board was further thermally cured for 90 minutes under the curing conditions after placing the board in an oven at 190° C.

After thermal curing, the polyimide adhesive tape was peeled off and the cured product was removed from the double-sided copper clad layered body with an epoxy resin-glass cloth base material. Further, the release PET film ("501010" available from Lintec Corporation) on which the resin composition layer was laminated was peeled off, thus obtaining a sheet-like cured product. The obtained cured product is referred to as a "cured product for evaluation".

A specimen having a width of about 7 mm and a length of about 40 mm was cut from the "cured product for evaluation" and subjected to dynamic mechanical analysis (DMA) in a tensile mode using a dynamic mechanical analyzer DMS-6100 (manufactured by Seiko Instruments Inc.). This measurement was carried out in a range of 25° C. to 240° C. at temperature rise of 2° C./min and a frequency of 1 Hz. The glass transition temperature (° C.) was determined to be a value obtained by rounding off the first decimal place of the maximum value of loss tangent (tan δ) obtained by the ratio of storage elastic modulus (E') and loss elastic modulus (E"). The results are listed in Table 2.

Measurement of Extracted Water Conductivity of Cured Product (Examples 1-1 to 1-3 and Comparative Examples 1-1 to 1-3)

The "cured product for evaluation" prepared in the section of "Measurement of glass transition temperature of cured prod" was pulverized using a pulverizer (PM-2005m, manufactured by Osaka Chemical Co., Ltd.) and the pulverized material was sieved. 2.0 g of the fraction passed through 150 μm and not passed through 75 μm was placed in a pressure-resistant container with 40 g of ultrapure water and the pressure-resistant container was sealed tightly. A sample prepared by placing 50 g of ultrapure water in a similar container and tightly sealing the container was used as a blank. The extraction conditions were determined to be 120° C. for 20 hours or 160° C. for 20 hours. After the extraction, the container was quickly cooled with ice water and the extracted suspension water was filtered through a membrane filter (MILLEX-GV, 0.22 μm, available from Merck Millipore Corporation). The electrical conductivity of each extracted water after filtration was measured together with the blank. The extracted water conductivities were calculated from the following calculation formula. The results are listed in Table 2.

Extracted water Conductivity (μS/cm)=Conductivity of extracted water−Conductivity of blank.

Measurement of Tensile Breaking Strength of Cured Product (Examples 2-1 to 2-3 and Comparative Examples 2-1 to 2-3)

The tensile breaking strengths of the cured products of the resin sheets of Examples 2-1 to 2-3 and the resin sheets of Comparative Examples 2-1 to 2-3 were measured by the following method.

A release PET film ("501010" available from Lintec Corporation, thickness 38 μm, 240 mm square) was placed on a double-sided copper clad layered body with an epoxy resin-glass cloth base material ("R5715ES" available from Matsushita Electric Works, Ltd., thickness 0.7 mm, 255 mm square) so that an untreated surface of the release PET film was in contact with the double-sided copper clad layered body. Then, four sides of the release PET film were fixed with a polyimide adhesive tape (width 10 mm).

Each of the resin sheets (200 mm square) including the resin composition layer having a thickness of 10 μm prepared in the Examples and Comparative Examples was laminated onto the center of the release PET film"501010", available from Lintec Corporation) so that the resin composition layer thereof was in contact with the release surface of the release PET film using a batch type vacuum pressure laminator (CVP 700, a two stage build-up laminator, manufactured by Nikko Materials Co., Ltd.) The lamination treatment was carried out by reducing the pressure for 30 seconds to an air pressure of 13 hPa or less and then pressing for 30 seconds at 100° C. and a pressure of 0.74 MPa.

Subsequently, the board was thermally cured for 30 minutes under a temperature condition of 100° C. after placing the board in an oven at 100° C., an then for 30 minutes under a temperature condition of 175° C. after transferring to an oven at 175° C. Thereafter, the board was taken out under a room temperature atmosphere and the release PET (support) was peeled off from the resin sheet. Thereafter, the board was further thermally cured for 90 minutes under the curing conditions after placing the board in an oven at 190° C.

After thermal curing, the sample to be subjected to a HAST test (Highly Accelerated temperature and humidity Stress Test) was heated, as it was, at 130° C. for 100 hours under the condition of a relative humidity of 85% using a highly accelerated life test apparatus ("PM422" manufactured by ETAC Engineering Co., Ltd.). Thereafter, the polyimide adhesive tape was peeled off and the cured product was removed from the double-sided copper clad layered body with an epoxy resin-glass cloth base material. Further, the release PET film ("50101" available from Lintec Corporation) on which the resin composition layer was laminated was peeled off, thus obtaining a sheet-like cured product after the HAST test having a thickness of 10 μm. For the sample not subjected to the HAST test, after thermal curing, the polyimide adhesive tape was peeled off and the cured product was removed from the double-sided copper clad layered body with an epoxy resin-glass cloth base material. Further, the release PET film on which the resin composition layer was laminated was peeled off, thus obtaining a sheet-like cured product having a thickness of 10 μm. Among the thus obtained cured products, the sample not subjected to the HAST test after curing are referred to as a "cured product A for evaluation", and the samples subjected to the HAST test after curing are referred to as a "cured product B for evaluation".

Each of the "cured product A for evaluation" and the "cured product B for evaluation" was cut out into a dumbbell shape to obtain test specimens. For test specimens, the tensile strength was measured in accordance with JIS K 7127 using a tensile testing machine RTC-1250A manufactured by Orientec Co., Ltd. to determine the tensile breaking strength (MPa) at 23° C. The measurement was carried out on five samples, and the average values of the top three values are listed in Table 3. In Table 3, "Tensile breaking strength A of cured product" represents the tensile breaking strength (MPa) of the cured product A for evaluation and "Tensile breaking strength B of cured product after HAST test" represents the tensile breaking strength (MPa) of the cured product B for evaluation, and "B/A" represents the ratio of "Tensile breaking strength B/Tensile breaking strength A".

Evaluation of Insulation Reliability and Measurement of Thickness of Insulating Layer Between Conductive Layers Evaluation test on insulation reliability and measurement of the thickness of insulating layer between conductive layers for the resin sheets of Examples 1-1 to 1-3 and Examples 2-1 to 2-3 and the resin sheets of Comparative Examples 1-1 to 1-3 and Comparative Examples 2-1 to 2-3 were carried out by the following method.

Preparation of Board for Evaluation (1) Substrate Treatment of Internal Layer Circuit Substrate As an internal layer circuit substrate, a double-sided copper clad layered body with an epoxy resin-glass cloth base material ("R1515F", available from Panasonic Corporation, thickness of copper foil 18 μm, thickness of substrate 0.3 mm) on both surfaces of which circuit conductors (copper) were formed with a wiring pattern of 1 mm square lattices (residual copper ratio: 59%) was prepared. Roughening treatment of both of copper surfaces of the internal layer circuit substrate was carried out with "CZ8201" available from MEC Co., Ltd. (copper etching amount: 0.5 μm)

(2) Lamination of Resin Sheet

Each of the resin sheets (including a resin composition layer having a thickness of 13 μm) prepared in Examples and Comparative Examples was laminated onto both surfaces of the internal layer circuit substrate with a batch type vacuum pressure laminator (2 stage build-up laminator, CVP700, manufactured by Nikko Materials Co., Ltd.) so that the resin composition layer thereof was in contact with the internal layer circuit substrate. The lamination was carried out by reducing the pressure for 30 seconds to an air pressure of 13 hPa or less and then pressing for 45 seconds at 130° C. and a pressure of 0.74 MPa, followed by thermal pressing for 75 seconds at 120° C. and a pressure of 0.5 MPa.

(3) Thermal Curing of Resin Composition Layer

The internal layer circuit substrate having the resin sheet laminated thereon was thermally cured for 30 minutes under a temperature condition of 100° C. after placing the internal layer circuit substrate in an oven at 100° C. and then for 30 minutes under a temperature condition of 175° C. after transferring the internal layer circuit substrate to an oven at 175° C., thus forming the insulating layer.

(4) Formation of Via Hole

A via hole having a top diameter (70 μm) was formed in the insulating layer on the conductor having the lattice pattern with a $CO_2$ laser processing machine "605GTWIII (-P)" manufactured by Mitsubishi Electric Corporation by irradiating with laser from above the insulating layer and the support. The insulating layer was irradiated with laser under irradiation conditions of a mask diameter of 2.5 mm, a pulse width of 16 μs, an energy of 0.39 mJ/shot, and a number of shots of 2, using a burst mode (10 kHz).

(5) Step of Carrying Out Roughening Treatment

The support was peeled off from the circuit board in which the via hole was formed and the desmear treatment was carried out. As the desmear treatment, the following wet desmear treatment was carried out.

Wet Desmear Treatment:

The insulating layer was immersed in a swelling liquid ("Swelling Dip Securiganth P", an aqueous solution of diethylene glycol monobutyl ether and sodium hydroxide, available from Atotech Japan K. K.) at 60° C. for 5 minutes, subsequently an oxidant solution ("Concentrate Compact CP", an aqueous solution of potassium permanganate having a concentration of about 6% and sodium hydroxide having a concentration of about 4%, available from Atotech Japan K. K) at 80° C. for 10 minutes, and finally a neutralizing liquid ("Reduction Solution Securiganth P", an aqueous solution of sulfuric acid, available from Atotech Japan K. K) at 40° C. for 5 minutes, and thereafter dried at 80° C. for 15 minutes.

(6) Step of Forming Conductive Layer (6-1) Electroless Plating Process

In order to form a conductive layer on a surface of the circuit board, a plating process including the following processes 1 to 6 (a copper plating process using a chemical solution available from Atotech Japan K. K.) was carried out to form the conductive layer.

1. Alkaline cleaning (cleaning of surface of insulating layer provided with via hole and charge adjustment)

Trade name: Cleaning Cleaner Securiganth 902 (trade name) was used to wash the circuit board at 60° C. for 5 minutes.

2. Soft etching (washing inside via hole)

The resultant circuit board was treated with sulfuric acidic aqueous solution of sodium peroxodisulfate at 30° C. for 1 minute.

3. Pre-dip (adjustment of charge on surface of insulating layer for Pd application)

The resultant circuit board was treated with Pre. Dip Neoganth B (trade name) at room temperature for 1 minute.

4. Activator application (application of Pd to surface of insulating layer)

The resultant circuit board was treated with Activator Neoganth 834 (trade name) at 35° C. for 5 minutes.

5. Reduction (reduction of Pd applied to insulating layer)

The resultant circuit board was treated with a mixed liquid of Reducer Neoganth WA (trade name) and Reducer Acceralator 810 mod. (trade name) at 30° C. for 5 minutes.

6. Electroless copper plating process (Cu is deposited on surface (Pd surface) of insulating layer)

The resultant circuit board was treated with a mixed liquid of Basic Solution Printganth MSK-DK (trade name), Copper solution Printganth MSK (trade name), Stabilizer Printganth MSK-DK (trade name), and Reducer Cu (trade name) at 35° C. for 20 minutes. The thickness of the electroless copper plating layer formed was 0.8 μm.

(6-2) Electrolytic Plating Process

Subsequently, an electrolytic copper plating process was carried out using a chemical solution available from Atotech Japan K. K under such condition that copper was filled in the via hole. Thereafter, as a resist pattern for patterning by etching, a conductive layer having a land and a conductor pattern of thickness of 10 μm was formed on a surface of the insulating layer using a land pattern of diameter of 1 mm that was conducted to the via hole and a circular conductor pattern of diameter of 10 mm that was not connected to the lower layer conductor. Subsequently, annealing treatment was carried out at 190° C. for 90 minutes. The obtained board was used as a board A for evaluation.

(7) Measurement of Thickness of Insulating Layer Between Conductive Layers

A cross section of the board A for evaluation was observed using a FIB-SEM complex apparatus ("SMI3050SE" manufactured by SII Nanotechnology Co., Ltd.). Specifically, a cross section in the direction perpendicular to a surface of the conductive layer was cut out by FIB (Focused Ion Beam) and a thickness of the insulating layer between the conductive layers was measured from a cross-sectional SEM image. For each sample, cross-sectional SEM images of randomly selected five sites were observed and the average value thereof was determined to be a thickness of the insulating layer between the conductive layers. The results are listed in Tables 2 and 3.

(8) Evaluation of Insulation Reliability of Insulating Layer

The board A for evaluation obtained above was conditioned using a highly accelerated life test apparatus ("PM422", manufactured by ETAC Engineering Co., Ltd.) for 200 hours under the condition of 130° C., a relative humidity of 85% and a DC voltage application of 3.3 V. The insulation resistance value of the board A for evaluation after conditioned was measured using an electrochemical migration tester ("ECM-100", manufactured by J-RAS Co., Ltd.) (n=6). In the measurement, a side of the circular conductor of diameter of 10 mm in the board A for evaluation obtained above was defined as a positive electrode and a side of the lattice conductor (copper) of the internal layer circuit substrate connected to the land of diameter of 1 mm was defined as a negative electrode. The case where all of the six test specimens had the insulation resistance values of $10^7 \Omega$ or more was determined to be good to be marked with a symbol of "+," whereas the case where even one test specimen had an insulation resistance value of less than $10^7 \Omega$ was determined to be problematic to be marked with a symbol of "−." The evaluation results are listed in Table 2 and Table 3. The insulation resistance values listed in Table 2 and Table 3 are the minimum values of the insulation resistance values of the six test specimens.

TABLE 2

|  | Example | | | Comparative Example | | |
| --- | --- | --- | --- | --- | --- | --- |
|  | 1-1 | 1-2 | 1-3 | 1-1 | 1-2 | 1-3 |
| Resin composition | 1 | 2 | 3 | 4 | 5 | 6 |
| Lowest melt viscosity of resin composition layer (poise) | 2900 | 2400 | 3600 | 3300 | 3100 | 2300 |
| Extracted water conductivity of cured product 120° C. × 20 h (μS/cm) | 33 | 47 | 35 | 63 | 56 | 45 |
| Extracted water conductivity of cured product 160° C. × 20 h (μS/cm) | 91 | 170 | 140 | 240 | 190 | 220 |
| Glass transition temperature of cured product (° C.) | 180 | 191 | 162 | 172 | 186 | 151 |
| Thickness of insulating layer between conductive layers (μm) | 5.0 | 5.1 | 5.4 | 5.1 | 4.9 | 5.3 |
| Evaluation of insulation reliability   Insulation resistance value (Ω) | $3.23 \times 10^8$ | $6.66 \times 10^9$ | $5.83 \times 10^{10}$ | $2.26 \times 10^2$ | $3.46 \times 10^4$ | $5.00 \times 10^3$ |
| Evaluation result | + | + | + | − | − | − |

TABLE 3

|  | | Example | | | Comparative Example | | |
| --- | --- | --- | --- | --- | --- | --- | --- |
|  | | 2-1 | 2-2 | 2-3 | 2-1 | 2-2 | 2-3 |
| Resin composition | | 1 | 2 | 3 | 4 | 5 | 6 |
| Lowest melt viscosity of resin composition layer (poise) | | 2900 | 2400 | 3600 | 3300 | 3100 | 2300 |
| Tensile breaking strength A of cured product (MPa) | | 88 | 81 | 77 | 75 | 80 | 73 |
| Tensile breaking strength B of cured product after HAST test (MPa) | | 71 | 59 | 60 | 44 | 39 | 46 |
| B/A | | 0.81 | 0.73 | 0.78 | 0.59 | 0.49 | 0.63 |
| Thickness of insulating layer between conductive layers (μm) | | 5.0 | 5.1 | 5.4 | 5.1 | 4.9 | 5.3 |
| Evaluation of insulation reliability | Insulation resistance value (Ω) | $3.23 \times 10^8$ | $6.66 \times 10^9$ | $5.83 \times 10^{10}$ | $2.26 \times 10^2$ | $3.46 \times 10^4$ | $5.00 \times 10^3$ |
|  | Evaluation result | + | + | + | − | − | − |

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A resin sheet, comprising:
   a support; and
   a resin composition layer being in contact on the support, wherein
   a ratio (B/A) of a tensile breaking strength B of a 10 μm thickness cured product of the resin composition layer after a HAST test to a tensile breaking strength A of a 10 μm thickness cured product of the resin composition layer is 0.65 or more and 1 or less.

2. The resin sheet according to claim 1, wherein the tensile breaking strength B is 50 MPa or more.

3. The resin sheet according to claim 1, wherein said resin composition layer has a thickness of 15 μm or less.

4. The resin sheet according to claim 1, wherein said resin composition layer has a lowest melt viscosity of 1000 poise or more.

5. The resin sheet according to claim 1, wherein said resin composition layer contains an epoxy resin and a curing agent.

6. The resin sheet according to claim 1, wherein
   said resin composition layer contains an inorganic filler in an amount of 50% by mass or more when a nonvolatile component in said resin composition layer is determined to be 100% by mass.

7. The resin sheet according to claim 6, wherein said inorganic filler has an average particle diameter of 0.05 μm to 0.35 μm.

8. The resin sheet according to claim 6, wherein a product of a specific surface area, in $m^2/g$, and a true density, in $g/cm^3$, of the inorganic filler is 0.1 to 77.

9. An insulating layer of a printed wiring board, prepared by curing a resin sheet according to claim 1.

10. The insulating layer according to claim 9, wherein said insulating layer is contained in a printed wiring board comprising a first conductive layer and a second conductive layer, and said insulating layer insulates said first conductive layer from said second conductive layer and has a thickness of 6 μm or less between said first conductive layer and said second conductive layer.

11. A printed wiring board, comprising:
    a first conductive layer,
    a second conductive layer, and
    an insulating layer that insulates said first conductive layer from said second conductive layer and has a thickness of 6 μm or less between said first conductive layer and said second conductive layer,
    wherein
    said insulating layer is a cured product of the resin composition layer of a resin sheet according to claim 1.

12. A semiconductor device, comprising the printed wiring board according to claim 11.

\* \* \* \* \*